United States Patent
Kato et al.

(10) Patent No.: US 12,519,446 B2
(45) Date of Patent: Jan. 6, 2026

(54) RADIO-FREQUENCY CIRCUIT AND COMMUNICATION DEVICE

(71) Applicant: Murata Manufacturing Co., Ltd., Nagaokakyo (JP)

(72) Inventors: Masanori Kato, Nagaokakyo (JP); Syunsuke Kido, Nagaokakyo (JP); Atsushi Ono, Nagaokakyo (JP); Hiroshi Matsubara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 367 days.

(21) Appl. No.: 18/116,984

(22) Filed: Mar. 3, 2023

(65) Prior Publication Data

US 2023/0318558 A1  Oct. 5, 2023

(30) Foreign Application Priority Data

Mar. 31, 2022 (JP) ................. 2022-061329

(51) Int. Cl.
*H03H 7/01* (2006.01)
*H03H 9/54* (2006.01)
*H04B 1/40* (2015.01)

(52) U.S. Cl.
CPC .......... *H03H 7/0115* (2013.01); *H03H 9/542* (2013.01); *H04B 1/40* (2013.01)

(58) Field of Classification Search
CPC ...... H03H 7/09; H03H 7/463; H03H 9/14502; H03H 9/6406; H03H 9/725; H03H 7/465; H03H 7/40
USPC .......................................... 455/73
See application file for complete search history.

(56) References Cited

U.S. PATENT DOCUMENTS

2020/0091894 A1  3/2020  Nakahashi
2020/0412336 A1* 12/2020  Hanaoka ................. H03H 9/70

FOREIGN PATENT DOCUMENTS

JP  2020-048067 A  3/2020

* cited by examiner

*Primary Examiner* — Ajibola A Akinyemi
(74) *Attorney, Agent, or Firm* — Keating & Bennett, LLP

(57) ABSTRACT

A radio-frequency circuit includes a first switch, a first filter, a second filter, a third filter, and a fourth filter. The first switch is capable of selectively connecting a first selection terminal or a second selection terminal to a first common terminal. The first filter and the second filter are connected to the first selection terminal. The third filter and the fourth filter are connected to the second selection terminal. The first filter and the third filter are band pass filters. The second filter is a band elimination filter. A pass band of the first filter and a rejection band of the second filter overlap each other. The pass band of the first filter and a pass band of the third filter overlap each other.

18 Claims, 10 Drawing Sheets

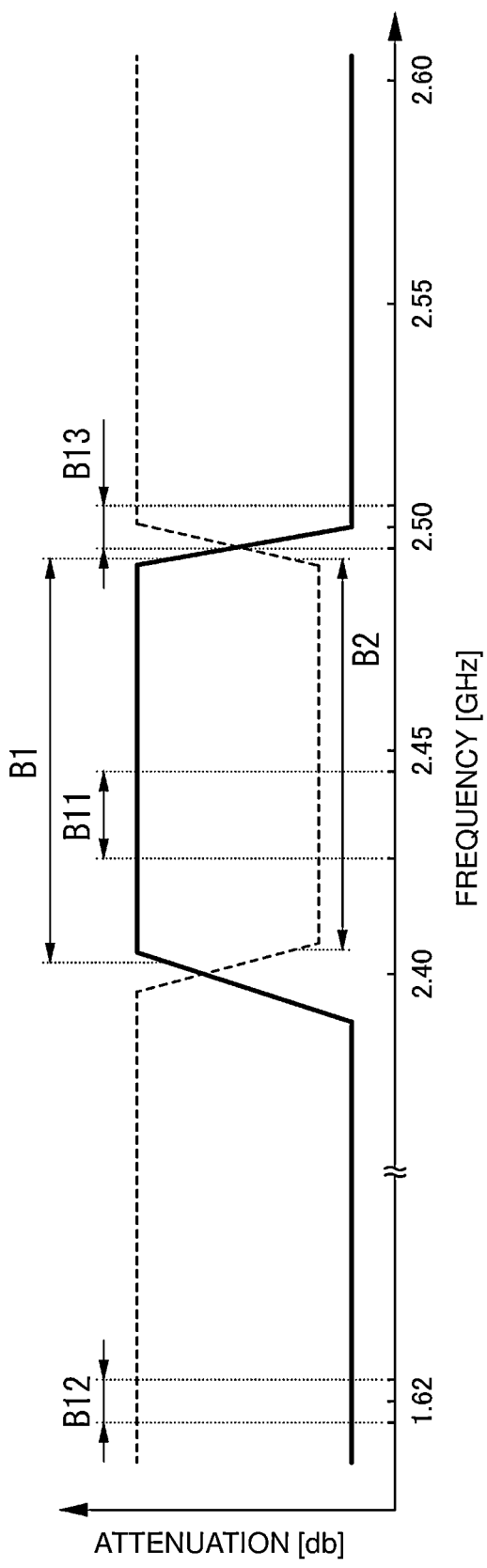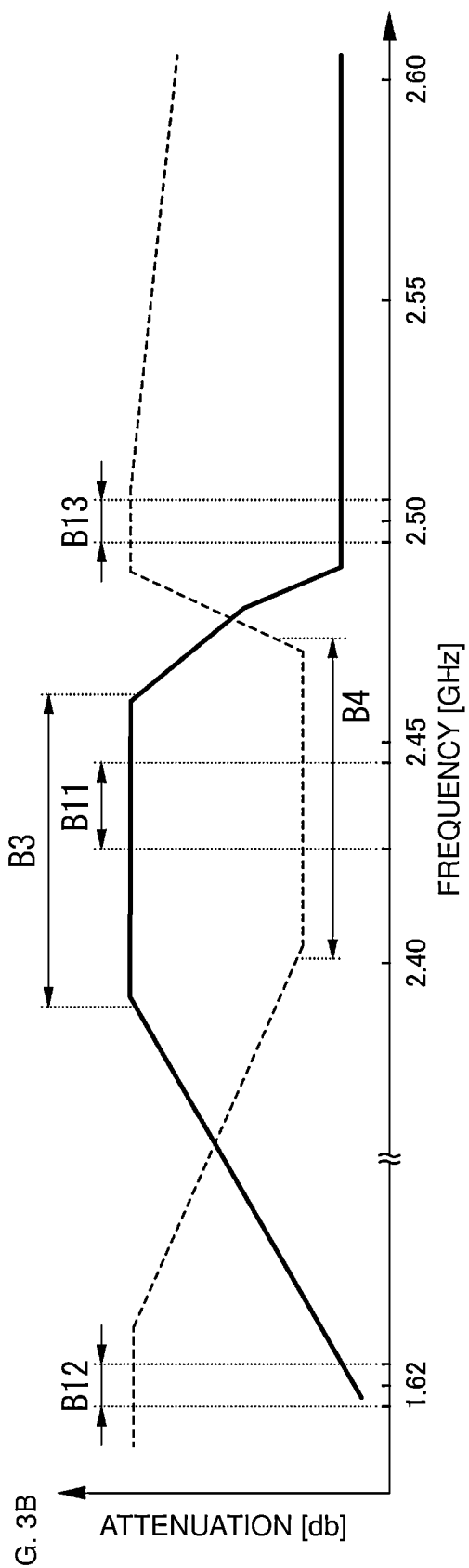

RADIO-FREQUENCY CIRCUIT AND COMMUNICATION DEVICE

CROSS REFERENCE TO RELATED APPLICATIONS

This application claims the benefit of priority to Japanese Patent Application No. 2022-061329 filed on Mar. 31, 2022. The entire contents of this application are hereby incorporated herein by reference.

BACKGROUND OF THE INVENTION

1. Field of the Invention

The present invention generally relates to a radio-frequency circuit and a communication device and, more specifically, to a radio-frequency circuit that includes a plurality of filters, and a communication device that includes the radio-frequency circuit.

2. Description of the Related Art

Japanese Unexamined Patent Application Publication No. 2020-048067 describes a radio-frequency circuit in which a band pass filter (BPF) and a band elimination filter (BEF) are combined. The band elimination filter is a band elimination filter that has a first frequency band as a rejection band. The band pass filter is a band pass filter that has a second frequency band as a pass band. The second frequency band at least partially overlaps the first frequency band. Therefore, the radio-frequency circuit of Japanese Unexamined Patent Application Publication No. 2020-048067 is capable of simultaneously processing a signal in a frequency band included in the first frequency band and the second frequency band and a signal in a frequency band not included in the first frequency band or the second frequency band.

However, in the radio-frequency circuit described in Japanese Unexamined Patent Application Publication No. 2020-048067, there are restrictions on the frequency bands of two signals allowing for simultaneous communication. In other words, in the radio-frequency circuit described in Japanese Unexamined Patent Application Publication No. 2020-048067, signals need to use frequency bands such that a communication band of one of the signals is included in the rejection band of the band elimination filter and the pass band of the band pass filter, and a communication band of the other one of the signals is not included in the first frequency band or the second frequency band.

SUMMARY OF THE INVENTION

Preferred embodiments of the present invention provide radio-frequency circuits and communication devices with high flexibility of combinations of frequency bands of two signals allowing for simultaneous communication.

A radio-frequency circuit according to an aspect of a preferred embodiment of the present invention includes a first switch, a first filter, a second filter, a third filter, and a fourth filter. The first switch includes a first common terminal, a first selection terminal, and a second selection terminal. The first filter is a band pass filter and is connected to the first selection terminal of the first switch. The second filter is a band elimination filter and is connected to the first selection terminal of the first switch. The third filter is a band pass filter and is connected to the second selection terminal of the first switch. The fourth filter is connected to the second selection terminal of the first switch. The first switch is capable of selectively connecting the first selection terminal or the second selection terminal to the first common terminal. A pass band of the first filter and a rejection band of the second filter overlap each other. The pass band of the first filter and a pass band of the third filter overlap each other.

A communication device according to an aspect of a preferred embodiment of the present invention includes the radio-frequency circuit and a signal processing circuit. The signal processing circuit is connected to the radio-frequency circuit.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A shows frequency characteristic curves of a first filter and a second filter of the radio-frequency circuit, and FIG. 3B shows frequency characteristic curves of a third filter and a fourth filter of the radio-frequency circuit.

DETAILED DESCRIPTION OF THE PREFERRED EMBODIMENTS

Hereinafter, radio-frequency circuits and communication devices according to first and second preferred embodiments and modifications thereof will be described with reference to the accompanying drawings.

First Preferred Embodiment

Initially, the configuration of a radio-frequency circuit 1 according to the first preferred embodiment will be described with reference to the drawings.

Figure 2:
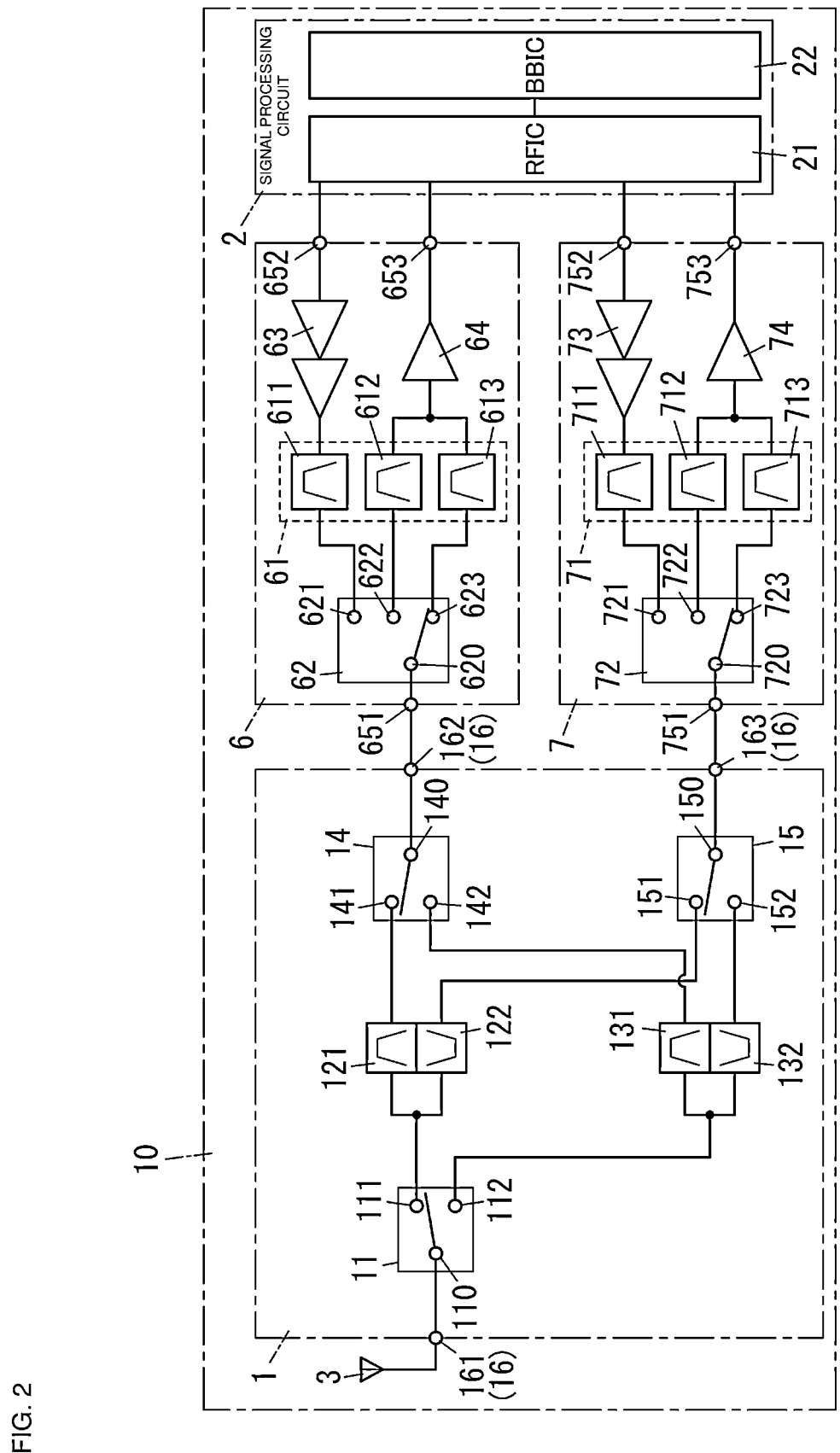
FIG. 2 is a circuit configuration diagram of a communication device including the above radio-frequency circuit.

As shown in FIG. 2, the radio-frequency circuit 1 is used in, for example, a communication device 10. The communication device 10 is, for example, a cellular phone, such as a smartphone. The communication device 10 is not limited to a cellular phone and may be, for example, a wearable terminal, such as a smart watch, or the like. The radio-frequency circuit 1 is, for example, a circuit that supports a fourth generation mobile communication (4G) standard, a fifth generation mobile communication (5G) standard, and the like, and a Wi-Fi (registered trademark) standard, a Bluetooth (registered trademark) standard, and the like. The 4G standard is, for example, a third generation partnership project (3GPP) long term evolution (LTE) standard. The 5G standard is, for example, 5G new radio (NR).

The radio-frequency circuit 1 is, for example, a module that supports carrier aggregation and dual connectivity. Carrier aggregation and dual connectivity mean technologies used for communication that uses radio waves in multiple frequency bands at the same time.

The communication device 10 performs communication in a plurality of communication bands. More specifically, the communication device 10 transmits a transmission signal in each of the plurality of communication bands and receives a reception signal in each of a plurality of communication bands. Specifically, the radio-frequency circuit 1 receives a reception signal in a first communication band, a reception signal in a second communication band, and a reception signal in a third communication band. The radio-frequency circuit 1 transmits a transmission signal in the first communication band, a transmission signal in the second communication band, and a transmission signal in the third communication band.

Some of the transmission signals and the reception signals in the plurality of communication bands are, for example, frequency division duplex (FDD) signals. The transmission signals and the reception signals in the plurality of communication bands are not limited to FDD signals and may be, for example, time division duplex (TDD) signals. FDD is a wireless communication technology that allocates different frequency bands to transmission and reception in wireless communication and performs transmission and reception. TDD is a wireless communication technology that allocates the same frequency band to transmission and reception in wireless communication and performs transmission and reception while switching between transmission and reception to time.

(2) Circuit Configuration of Radio-Frequency Circuit

Next, the circuit configuration of the radio-frequency circuit 1 according to the first preferred embodiment will be described with reference to FIG. 1.

Figure 1:
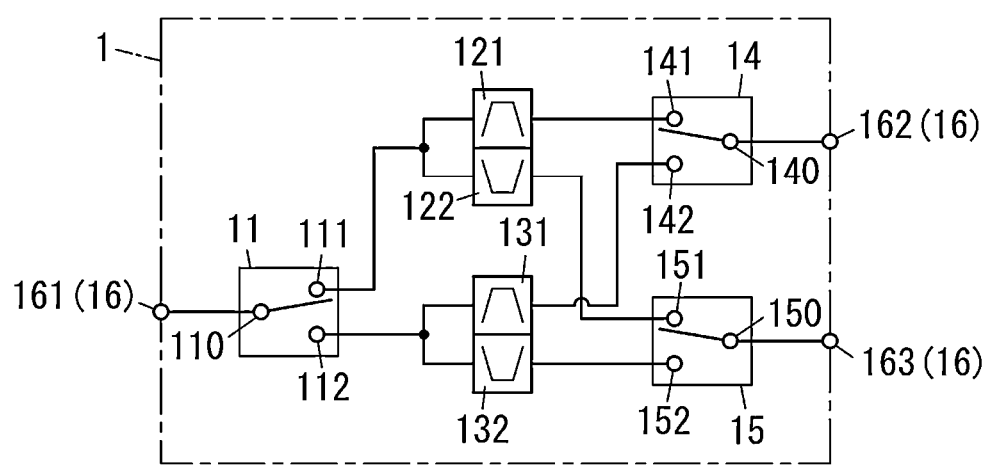
FIG. 1 is a circuit configuration diagram that shows a radio-frequency circuit according to a first preferred embodiment of the present invention.

As shown in FIG. 1, the radio-frequency circuit 1 according to the first preferred embodiment includes a first filter 121, a second filter 122, a third filter 131, and a fourth filter 132. The radio-frequency circuit 1 according to the first preferred embodiment further includes a first switch 11, a second switch 14, and a third switch 15. The radio-frequency circuit 1 according to the first preferred embodiment further includes a plurality of (three in the illustrated example) external connection terminals 16. The plurality of external connection terminals 16 includes an antenna terminal 161, a first input and output terminal 162, and a second input and output terminal 163.

(2.1) First to Fourth Filters

The first filter 121, the second filter 122, the third filter 131, and the fourth filter 132 are filters that respectively pass signals in frequency bands different from one another. More specifically, the first filter 121 is a band pass filter (BPF) that has a first frequency band B1 (see FIG. 3A) as a pass band. The second filter 122 is a band elimination filter (BEF) that has a second frequency band B2 (see FIG. 3A) as a rejection band. The third filter 131 is a band pass filter that has a third frequency band B3 (see FIG. 3B) as a pass band. The fourth filter 132 is a band elimination filter that has a fourth frequency band B4 (see FIG. 3B) as a rejection band.

Each of the first filter 121, the second filter 122, the third filter 131, and the fourth filter 132 is, for example, an acoustic wave filter including one or more acoustic wave resonators. The first filter 121, the second filter 122, the third filter 131, and the fourth filter 132 are, for example, included in a single electronic component. A single electronic component includes, for example, a substrate and a circuit portion formed on the substrate. The substrate has a first surface and a second surface opposite to each other in a thickness direction of the substrate. The substrate is, for example, a piezoelectric substrate. The piezoelectric substrate is, for example, a lithium niobate substrate, a lithium tantalate substrate, or a quartz crystal substrate. The circuit portion has a plurality of interdigital transducer electrodes in a one-to-one correspondence with a plurality of series arm resonators and a plurality of interdigital transducer electrodes in a one-to-one correspondence with a plurality of parallel arm resonators. Alternatively, the first filter 121 and the second filter 122 may be included in a single electronic component, and the third filter 131 and the fourth filter 132 may be included in another single electronic component.

As shown in FIG. 3A, the first frequency band B1 and the second frequency band B2 overlap each other. Here, the phrase "the first frequency band B1 and the second frequency band B2 overlap each other" means that the first frequency band B1 and the second frequency band B2 at least partially overlap each other. In other words, there is a frequency band included in both the first frequency band B1 and the second frequency band B2. Similarly, as shown in FIG. 3B, the third frequency band B3 and the fourth frequency band B4 overlap each other.

In addition, the first frequency band B1 and the third frequency band B3 overlap each other.

The first frequency band B1 and the third frequency band B3 do not completely coincide with each other. Here, the phrase "the first frequency band B1 and the third frequency band B3 do not completely coincide with each other" means that a portion of the first frequency band B1 does not overlap the third frequency band B3 or a portion of the third frequency band B3 does not overlap the first frequency band B1. In other words, there is a frequency band included in only any one of the first frequency band B1 and the third frequency band B3 and not included in the other. Similarly, the second frequency band B2 and the fourth frequency band B4 do not completely coincide with each other.

Here, the pass band of a filter means the range of frequency in which an attenuation for a signal at the frequency is higher than or equal to a certain value. More specifically, the pass band of a filter means a frequency band in which the ratio between an attenuation for a signal at the frequency and a maximum value of the attenuation is lower than or equal to about 3 dB. Here, the rejection band of a filter means the range of frequency in which an attenuation for a signal at the frequency is lower than a certain value. More specifically, the pass band of a filter means a frequency band in which the ratio between an attenuation for a signal at the frequency and a maximum value of the attenuation exceeds about 3 dB.

(2.2) First Switch

As shown in FIG. 1, the first switch 11 is a switch to switch a path connected to the antenna terminal 161 from between a combination of the first filter 121 and the second filter 122 and a combination between the third filter 131 and the fourth filter 132. In other words, the first switch 11 is a switch to switch a path to be connected to the antenna terminal 161. The first switch 11 includes the common terminal 110 and a plurality of (two in the illustrated example) selection terminals 111, 112.

The common terminal 110 is connected to the antenna terminal 161. The selection terminal 111 is connected to the first filter 121 and the second filter 122. The selection terminal 112 is connected to the third filter 131 and the fourth filter 132. With the radio-frequency circuit 1 according to the first preferred embodiment, the common terminal 110 is a first common terminal, and the selection terminal 111 is a first selection terminal, and the selection terminal 112 is a second selection terminal. In other words, the first switch 11 has a first common terminal (common terminal 110), a first selection terminal (selection terminal 111), and a second selection terminal (selection terminal 112). In the first switch 11, the first common terminal is capable of connecting with any one of the first selection terminal and the second selection terminal.

The first switch 11 switches connection between the common terminal 110 and one of the plurality of selection terminals 111, 112. The first switch 11 is, for example, controlled by a signal processing circuit 2 (see FIG. 2). The first switch 11 electrically connects the common terminal 110 with any one of the plurality of selection terminals 111, 112 in accordance with a control signal from an RF signal processing circuit 21 (see FIG. 2) of the signal processing circuit 2.

(2.3) Second Switch

The second switch 14 is a switch to switch a filter connected to the first input and output terminal 162 between the first filter 121 and the third filter 131. In other words, the second switch 14 is a switch to switch a path connected to the first input and output terminal 162. The second switch 14 has a common terminal 140 and a plurality of (two in the illustrated example) selection terminals 141, 142.

The common terminal 140 is connected to the first input and output terminal 162. The selection terminal 141 is connected to the first filter 121. The selection terminal 142 is connected to the third filter 131. With the radio-frequency circuit 1 according to the first preferred embodiment, the common terminal 140 is a second common terminal, the selection terminal 141 is a third selection terminal, and the selection terminal 142 is a fourth selection terminal. In other words, the second switch 14 includes a second common terminal (common terminal 140), a third selection terminal (selection terminal 141), and a fourth selection terminal (selection terminal 142). In the second switch 14, the second common terminal is capable of connecting with any one of the third selection terminal and the fourth selection terminal.

The second switch 14 switches connection between the common terminal 140 and one of the plurality of selection terminals 141, 142. The second switch 14 is, for example, controlled by the signal processing circuit 2 (see FIG. 2). The second switch 14 electrically connects the common terminal 140 with any one of the plurality of selection terminals 141, 142 in accordance with a control signal from the RF signal processing circuit 21 (see FIG. 2) of the signal processing circuit 2.

(2.4) Third Switch

The third switch 15 is a switch to switch a filter connected to the second input and output terminal 163 between the second filter 122 and the fourth filter 132. In other words, the third switch 15 is a switch to switch a path connected to the second input and output terminal 163. The third switch 15 includes a common terminal 150 and a plurality of (two in the illustrated example) selection terminals 151, 152.

The common terminal 150 is connected to the second input and output terminal 163. The selection terminal 151 is connected to the second filter 122. The selection terminal 152 is connected to the fourth filter 132. With the radio-frequency circuit 1 according to the first preferred embodiment, the common terminal 150 is a third common terminal, the selection terminal 151 is a fifth selection terminal, and the selection terminal 152 is a sixth selection terminal. In other words, the third switch 15 has a third common terminal (common terminal 150), a fifth selection terminal (selection terminal 151), and a sixth selection terminal (selection terminal 152). In the third switch 15, the third common terminal is capable of connecting with any one of the fifth selection terminal and the sixth selection terminal.

The third switch 15 switches connection between the common terminal 150 and one of the plurality of selection terminals 151, 152. The third switch 15 is, for example, controlled by the signal processing circuit 2 (see FIG. 2). The third switch 15 electrically connects the common terminal 150 with any one of the plurality of selection terminals 151, 152 in accordance with a control signal from the RF signal processing circuit 21 (see FIG. 2) of the signal processing circuit 2.

(2.5) External Connection Terminal

The plurality of external connection terminals 16 are terminals to electrically connect with an external circuit (for example, the signal processing circuit 2). The plurality of external connection terminals 16 includes the antenna terminal 161, the first input and output terminal 162, the second input and output terminal 163, a plurality of control terminals (not shown), and a plurality of ground terminals (not shown).

An antenna 3 (see FIG. 2) is connected to the antenna terminal 161. In the radio-frequency circuit 1, the antenna terminal 161 is connected to the first switch 11. The antenna terminal 161 is connected to the first filter 121, the second filter 122, the third filter 131, and the fourth filter 132 with the first switch 11 interposed therebetween.

The first input and output terminal 162 is a terminal to input a transmission signal from a first external circuit (for example, the signal processing circuit 2) to the radio-frequency circuit 1 or output a reception signal from the radio-frequency circuit 1 to the first external circuit. In the radio-frequency circuit 1, the first input and output terminal 162 is connected to the second switch 14. The first input and output terminal 162 is connected to the first filter 121 and the third filter 131 with the second switch 14 interposed therebetween.

The second input and output terminal 163 is a terminal to input a transmission signal from a second external circuit (for example, the signal processing circuit 2) to the radio-frequency circuit 1 or output a reception signal from the radio-frequency circuit 1 to the second external circuit. In the radio-frequency circuit 1, the second input and output terminal 163 is connected to the third switch 15. The second input and output terminal 163 is connected to the second filter 122 and the fourth filter 132 with the third switch 15 interposed therebetween.

(3) Communication Device

As shown in FIG. 2, the communication device 10 includes a first radio-frequency circuit (radio-frequency circuit) 1, the signal processing circuit 2, the antenna 3, a second radio-frequency circuit 6, and a third radio-frequency circuit 7. The signal processing circuit 2 is connected to the first radio-frequency circuit 1. More specifically, the signal processing circuit 2 is connected to the first radio-frequency circuit 1 with the second radio-frequency circuit 6 and the third radio-frequency circuit 7, interposed therebetween.

(3.1) Antenna

As shown in FIG. 2, the antenna 3 is connected to the antenna terminal 161 of the radio-frequency circuit 1. The antenna 3 has a transmission function of radiating a transmission signal output from the radio-frequency circuit 1 and a reception function of receiving a reception signal from an outside as radio waves and outputting the reception signal to the radio-frequency circuit 1.

(3.2) Second Radio-Frequency Circuit

As shown in FIG. 2, the second radio-frequency circuit 6 includes a multiplexer 61, a switch 62, a power amplifier 63, a low-noise amplifier 64, and first to third signal terminals 651 to 653.

The multiplexer 61 includes a plurality of (three in the illustrated example) filters 611 to 613. The filter 611 is, for example, a transmission filter that passes a transmission signal in a transmission band of a first communication band and a third communication band. The filter 612 is, for example, a receiving filter that passes a reception signal in a receiving band of the first communication band. The filter 613 is, for example, a receiving filter that passes a reception signal in a receiving band of the third communication band. The filter 611 is provided in a signal path between the switch 62 and the power amplifier 63. The filters 612, 613 are respectively provided in signal paths between the switch 62 and the low-noise amplifier 64.

The switch 62 switches a filter connected to the first radio-frequency circuit 1 among the plurality of filters 611 to 613. In other words, the switch 62 is a switch to switch a path connected to the first radio-frequency circuit 1. The switch 62 includes a common terminal 620 and a plurality of (three in the illustrated example) selection terminals 621 to 623. The common terminal 620 is connected to the first signal terminal 651. The selection terminal 621 is connected to the filter 611. The selection terminal 622 is connected to the filter 612. The selection terminal 623 is connected to the filter 613.

The switch 62 switches the state of connection between the common terminal 620 and each of the plurality of selection terminals 621 to 623. The switch 62 is, for example, controlled by the signal processing circuit 2. The switch 62 electrically connects the common terminal 620 with at least one of the plurality of selection terminals 621 to 623 in accordance with a control signal from the RF signal processing circuit 21 of the signal processing circuit 2.

The power amplifier 63 is an amplifier that amplifies a transmission signal. The power amplifier 63 is provided between the filter 611 and the second signal terminal 652. The power amplifier 63 includes an input terminal (not shown) and an output terminal (not shown). The input terminal of the power amplifier 63 is connected to an external circuit (for example, the signal processing circuit 2) with the second signal terminal 652 interposed therebetween. The output terminal of the power amplifier 63 is connected to the filter 611. The power amplifier 63 is, for example, controlled by a controller (not shown).

The low-noise amplifier 64 is an amplifier that amplifies a reception signal with low noise. The low-noise amplifier 64 is provided between the third signal terminal 653 and the filters 612, 613. The low-noise amplifier 64 includes an input terminal (not shown) and an output terminal (not shown). The input terminal of the low-noise amplifier 64 is connected to the filters 612, 613. The output terminal of the low-noise amplifier 64 is connected to an external circuit (for example, the signal processing circuit 2) with the third signal terminal 653 interposed therebetween.

The first signal terminal 651 is a terminal to electrically connect with the first radio-frequency circuit 1. The first signal terminal 651 is connected to the first input and output terminal 162 of the first radio-frequency circuit 1. In the second radio-frequency circuit 6, the first signal terminal 651 is connected to the common terminal 620 of the switch 62.

The second signal terminal 652 and the third signal terminal 653 are terminals to electrically connect with the signal processing circuit 2. In the second radio-frequency circuit 6, the second signal terminal 652 is connected to the input terminal of the power amplifier 63. In the second radio-frequency circuit 6, the third signal terminal 653 is connected to the output terminal of the low-noise amplifier 64.

(3.3) Third Radio-Frequency Circuit

As shown in FIG. 2, the third radio-frequency circuit 7 includes a multiplexer 71, a switch 72, a power amplifier 73, a low-noise amplifier 74, and first to third signal terminals 751 to 753.

The multiplexer 71 includes a plurality of (three in the illustrated example) filters 711 to 713. The filter 711 is, for example, a transmission filter that passes a transmission signal in a transmission band of a second communication band and a fourth communication band. The filter 712 is, for example, a receiving filter that passes a reception signal in a receiving band of the second communication band. The filter 713 is, for example, a receiving filter that passes a reception signal in a receiving band of the fourth communication band. The filter 711 is provided in a signal path between the switch 72 and the power amplifier 73. The filters 712, 713 are respectively provided in signal paths between the switch 72 and the low-noise amplifier 74.

The switch 72 switches a filter connected to the first radio-frequency circuit 1 among the plurality of filters 711 to 713. In other words, the switch 72 is a switch to switch a path connected to the first radio-frequency circuit 1. The switch 72 has a common terminal 720 and a plurality of (three in the illustrated example) selection terminals 721 to 723. The common terminal 720 is connected to the first signal terminal 751. The selection terminal 721 is connected to the filter 711. The selection terminal 722 is connected to the filter 712. The selection terminal 723 is connected to the filter 713.

The switch 72 switches the state of connection between the common terminal 720 and each of the plurality of selection terminals 721 to 723. The switch 72 is, for example, controlled by the signal processing circuit 2. The switch 72 electrically connects the common terminal 720 with at least one of the plurality of selection terminals 721 to 723 in accordance with a control signal from the RF signal processing circuit 21 of the signal processing circuit 2.

The power amplifier 73 is an amplifier that amplifies a transmission signal. The power amplifier 73 is provided between the filter 711 and the second signal terminal 752. The power amplifier 73 has an input terminal (not shown) and an output terminal (not shown). The input terminal of the power amplifier 73 is connected to an external circuit (for example, the signal processing circuit 2) with the second signal terminal 752 interposed therebetween. The output terminal of the power amplifier 73 is connected to the filter 711. The power amplifier 73 is, for example, controlled by a controller (not shown).

The low-noise amplifier 74 is an amplifier that amplifies a reception signal with low noise. The low-noise amplifier 74 is provided between the third signal terminal 753 and each of the filters 712, 713. The low-noise amplifier 74 includes an input terminal (not shown) and an output terminal (not shown). The input terminal of the low-noise amplifier 74 is connected to the filters 712, 713. The output terminal of the low-noise amplifier 74 is connected to an external circuit (for example, the signal processing circuit 2) with the third signal terminal 753 interposed therebetween.

The first signal terminal 751 is a terminal to electrically connect with the first radio-frequency circuit 1. The first signal terminal 751 is connected to the second input and output terminal 163 of the first radio-frequency circuit 1. In the third radio-frequency circuit 7, the first signal terminal 751 is connected to the common terminal 720 of the switch 72.

The second signal terminal 752 and the third signal terminal 753 are terminals to electrically connect with the signal processing circuit 2. In the third radio-frequency circuit 7, the second signal terminal 752 is connected to the input terminal of the power amplifier 73. In the third radio-frequency circuit 7, the third signal terminal 753 is connected to the output terminal of the low-noise amplifier 74.

(3.4) Signal Processing Circuit

As shown in FIG. 2, the signal processing circuit 2 includes the RF signal processing circuit 21 and a baseband signal processing circuit 22. The signal processing circuit 2 processes a signal that passes through the radio-frequency circuit 1. More specifically, the signal processing circuit 2 processes a transmission signal and a reception signal.

The RF signal processing circuit 21 is, for example, a radio frequency integrated circuit (RFIC). The RF signal processing circuit 21 performs signal processing on a radio-frequency signal.

The RF signal processing circuit 21 performs signal processing, such as up conversion, and amplification on a transmission signal transmitted from the baseband signal processing circuit 22 and outputs the processed transmission signal to the radio-frequency circuit 1. The RF signal processing circuit 21 performs amplification and signal processing, such as down conversion, on a reception signal output from the radio-frequency circuit 1 and outputs the processed reception signal to the baseband signal processing circuit 22.

The baseband signal processing circuit 22 is, for example, a baseband integrated circuit (BBIC). The baseband signal processing circuit 22 performs predetermined signal processing on a transmission signal from outside the signal processing circuit 2. The reception signal processed by the baseband signal processing circuit 22 is, for example, used as an image signal to display an image or used as a voice signal to call.

The RF signal processing circuit 21 also has the function of a control unit to control connection of each of the first switch 11, the second switch 14, and the third switch 15 of the radio-frequency circuit 1 in accordance with transmission or reception of a radio-frequency signal (a transmission signal or a reception signal). Specifically, the RF signal processing circuit 21 switches connection of each of the first switch 11, the second switch 14, and the third switch 15 of the radio-frequency circuit 1 in accordance with a control signal (not shown). The control unit may be provided outside the RF signal processing circuit 21 or may be provided in, for example, the radio-frequency circuit 1 or the baseband signal processing circuit 22.

(4) Operation of Radio-Frequency Circuit

In the radio-frequency circuit 1 according to the first preferred embodiment, a carrier frequency for a transmission signal and a reception signal in the first external circuit and a carrier frequency for a transmission signal and a reception signal in the second external circuit are different from each other. The first external circuit and the second external circuit are allowed to use an antenna and the like connected to the antenna terminal 161 at the same time, and the radio-frequency circuit 1 is allowed to perform simultaneous communication with two signals.

The radio-frequency circuit 1 according to the first preferred embodiment has a first mode and a second mode as operation modes.

In the first mode, the common terminal 110 of the first switch 11 is connected to the selection terminal 111. In the first mode, the common terminal 140 of the second switch 14 is connected to the selection terminal 141. In the first mode, the common terminal 150 of the third switch 15 is connected to the selection terminal 151. Therefore, in the first mode, the first filter 121 is connected between the first input and output terminal 162 and the antenna terminal 161. In the first mode, the second filter 122 is connected between the second input and output terminal 163 and the antenna terminal 161. In other words, in the first mode, the radio-frequency circuit 1 allows simultaneous communication of a signal that passes through the first filter 121 and a signal that passes through the second filter 122.

As described above, the first filter 121 is a band pass filter that has the first frequency band B1 as a pass band. The second filter 122 is a band elimination filter that has the second frequency band B2 as a rejection band. As shown in FIG. 3A, the first frequency band B1 and the second frequency band B2 at least partially overlap each other. In FIG. 3A, in the radio-frequency circuit 1 according to the first preferred embodiment, the continuous line represents the frequency characteristics of the first filter 121, and the dashed line represents the frequency characteristics of the second filter 122. In the radio-frequency circuit 1, there is a frequency band (hereinafter, referred to as "first available band") included in both the first frequency band B1 and the second frequency band B2. The first communication band is included in the first available band. As shown in FIG. 3A, a first communication band B11 is included in the first available band. In the radio-frequency circuit 1, there is a frequency band (hereinafter, referred to as "second available band") not included in the first frequency band B1 or the second frequency band B2. The second communication band is included in the second available band. As shown in FIG. 3A, a second communication band B12 is included in the second available band.

Thus, in the radio-frequency circuit 1 according to the first preferred embodiment, in the first mode, a signal included in the transmission band or the receiving band of the first communication band does not leak from the second input and output terminal 163. Similarly, in the first mode, a signal included in the transmission band or the receiving band of the second communication band does not leak from the first input and output terminal 162. Therefore, in the radio-frequency circuit 1 according to the first preferred embodiment, in the first mode, the carrier frequency can transmit a transmission signal or a reception signal in the first available band between the antenna terminal 161 and the first input and output terminal 162. In addition, in the radio-frequency circuit 1 according to the first preferred embodiment, in the first mode, at the same time, the carrier frequency can transmit a transmission signal or a reception signal included in the second available band between the antenna terminal 161 and the second input and output terminal 163. In other words, in the radio-frequency circuit 1 according to the first preferred embodiment, in the first mode, simultaneous communication using a signal of which the carrier frequency is included in the first available band and a signal of which the carrier frequency is included in the second available band is possible.

In the second mode, the common terminal 110 of the first switch 11 is connected to the selection terminal 112. In the second mode, the common terminal 140 of the second switch 14 is connected to the selection terminal 142. In the second mode, the common terminal 150 of the third switch 15 is connected to the selection terminal 152. Therefore, in the second mode, the third filter 131 is connected between the first input and output terminal 162 and the antenna terminal 161. In the second mode, the fourth filter 132 is connected between the second input and output terminal 163 and the antenna terminal 161. In other words, in the second mode, the radio-frequency circuit 1 allows simultaneous communication of a signal that passes through the third filter 131 and a signal that passes through the fourth filter 132.

As described above, the third filter 131 is a band pass filter that has the third frequency band B3 as a pass band. The fourth filter 132 is a band elimination filter that has the fourth frequency band B4 as a rejection band. As shown in FIG. 3B, the third frequency band B3 and the fourth frequency band B4 at least partially overlap each other. In FIG. 3B, in the radio-frequency circuit 1 according to the first preferred embodiment, the continuous line represents the frequency characteristics of the third filter 131, and the dashed line represents the frequency characteristics of the fourth filter 132. In the radio-frequency circuit 1, there is a frequency band (hereinafter, referred to as "third available band") included in both the third frequency band B3 and the fourth frequency band B4. The third communication band is included in the third available band. As shown in FIG. 3B, the first communication band B11 is included in the third available band. In the radio-frequency circuit 1 according to the first preferred embodiment, there is a frequency band (hereinafter, referred to as "fourth available band") not included in the third frequency band B3 or the fourth frequency band B4. The fourth communication band is included in the fourth available band. As shown in FIG. 3B, a third communication band B13 is included in the fourth available band.

Thus, in the radio-frequency circuit 1 according to the first preferred embodiment, in the second mode, a signal included in the transmission band or the receiving band of the third communication band does not leak from the second input and output terminal 163. Similarly, in the second mode, a signal included in the transmission band or the receiving band of the fourth communication band does not leak from the first input and output terminal 162. Therefore, in the radio-frequency circuit 1 according to the first preferred embodiment, in the second mode, the carrier frequency can transmit a transmission signal or a reception signal included in the third available band between the antenna terminal 161 and the first input and output terminal 162. In addition, in the radio-frequency circuit 1 according to the first preferred embodiment, at the same time, the carrier frequency can transmit a transmission signal or a reception signal included in the fourth available band between the antenna terminal 161 and the second input and output terminal 163. In other words, in the radio-frequency circuit 1 according to the first preferred embodiment, in the second mode, simultaneous communication using a signal of which the carrier frequency is included in the third available band and a signal of which the carrier frequency is included in the fourth available band is possible.

In addition, the first frequency band B1 that is the pass band of the first filter and the third frequency band B3 that is the pass band of the third filter at least partially overlap each other. Therefore, the first available band and the third available band at least partially overlap each other. Thus, regardless of whether the operation mode is the first mode or the second mode, a signal in a frequency band included in both the first available band and the third available band is allowed to pass between the antenna terminal 161 and the first input and output terminal 162. In other words, at least a portion of the range of the carrier frequency of a transmission signal or a reception signal input to or output from the first input and output terminal 162 overlaps between the first mode and the second mode. In the radio-frequency circuit 1 according to the first preferred embodiment, in any one of the first mode and the second mode, the first external circuit is allowed to use the first communication band B11. The second external circuit uses the second communication band B12 in the first mode and uses the third communication band B13 in the second mode.

Therefore, in the radio-frequency circuit 1 according to the first preferred embodiment, a combination of communication bands for two signals allowing for simultaneous communication is easily changed. Since the first frequency band B1 and the third frequency band B3 overlap each other, there is a communication band that the first external circuit is allowed to use commonly in the first mode and in the second mode.

In the radio-frequency circuit 1 according to the first preferred embodiment, the first frequency band B1 and the third frequency band B3 are not completely the same, and there is a different part between the first frequency band B1 and the third frequency band B3. In other words, there is a frequency included in any one of the first frequency band B1 and the third frequency band B3 and not included in the other. Therefore, it is easy to design the communication band that the second external circuit is allowed to use in the first mode and in the second mode. For example, as shown in FIGS. 3A and 3B, in a combination of the first filter 121 and the fourth filter 132, the attenuation of the first filter 121 in the third communication band B13 is not sufficient. Therefore, in a combination of the first filter 121 and the fourth filter 132, isolation between a signal in the first communication band B11 and a signal in the third communication band B13 can be not sufficient. Similarly, in a combination of the third filter 131 and the second filter 122, the attenuation of the third filter 131 in the second communication band B12 is not sufficient. Therefore, in a combination of the third filter 131 and the second filter 122, isolation between a signal in the first communication band B11 and a signal in the second communication band B12 can be not sufficient when the second external circuit uses the second communication band B12.

In contrast, in the radio-frequency circuit 1 according to the first preferred embodiment, the first frequency band B1 and the third frequency band B3 do not completely coincide with each other, and there is a different part between the first frequency band B1 and the third frequency band B3. Therefore, in the radio-frequency circuit 1 according to the first preferred embodiment, the bandpass characteristics of the first filter 121 and the bandpass characteristics of the second filter 122 are optimized for the operation of the radio-frequency circuit 1 in the first mode. In the radio-frequency circuit 1 according to the first preferred embodiment, the bandpass characteristics of the third filter 131 and the bandpass characteristics of the fourth filter 132 are optimized for the operation of the radio-frequency circuit 1 in the second mode. Therefore, in the radio-frequency circuit 1 according to the first preferred embodiment, in the first mode, simultaneous communication using a transmission signal or a reception signal of which the carrier frequency is included in the first communication band B11 and a transmission signal or a reception signal of which the carrier frequency is included in the second communication band B12 is possible. In the radio-frequency circuit 1 according to the first preferred embodiment, in the second mode, simultaneous communication using a transmission signal or a reception signal of which the carrier frequency is included in the first communication band B11 and a transmission signal or a reception signal of which the carrier frequency is included in the third communication band B13 is possible.

Similarly, in the radio-frequency circuit 1 according to the first preferred embodiment, the range of the second frequency band B2 and the range of the fourth frequency band B4 are not completely the same. In other words, there is a frequency included in any one of the second frequency band B2 and the fourth frequency band B4 and not included in the other. Therefore, similarly, it is easy to design the communication band that the first external circuit is allowed to use in the first mode and in the second mode.

(5) Advantageous Effects

As described above, the radio-frequency circuit 1 according to the first preferred embodiment is capable of performing simultaneous communication using a signal that passes through the first filter 121 and a signal that passes through the second filter 122 in the first mode.

As described above, the radio-frequency circuit 1 according to the first preferred embodiment is capable of performing simultaneous communication using a signal that passes through the third filter 131 and a signal that passes through the fourth filter 132 in the second mode.

In addition, in the radio-frequency circuit 1 according to the first preferred embodiment, the first frequency band B1 and the third frequency band B3 at least partially overlap each other. Thus, there is a carrier frequency that can be used commonly in the first mode and in the second mode for a transmission signal or a reception signal input to or output from the radio-frequency circuit 1 through the first input and output terminal 162.

In the radio-frequency circuit 1 according to the first preferred embodiment, the first frequency band B1 and the third frequency band B3 do not completely coincide with each other. Therefore, in the radio-frequency circuit 1 according to the first preferred embodiment, the pass band of the first filter 121 and the rejection band of the second filter 122 can be designed so as to be suitable for the operation of the radio-frequency circuit 1 in the first mode. In the radio-frequency circuit 1 according to the first preferred embodiment, the pass band of the third filter 131 and the rejection band of the fourth filter 132 can be designed so as to be suitable for the operation of the radio-frequency circuit 1 in the second mode.

In the radio-frequency circuit 1 according to the first preferred embodiment, the second frequency band B2 and the fourth frequency band B4 do not completely coincide with each other. Therefore, in the radio-frequency circuit 1 according to the first preferred embodiment, similarly, the pass band of the first filter 121 and the rejection band of the second filter 122 can be designed so as to be suitable for the operation of the radio-frequency circuit 1 in the first mode. In the radio-frequency circuit 1 according to the first preferred embodiment, the pass band of the third filter 131 and the rejection band of the fourth filter 132 can be designed so as to be suitable for the operation of the radio-frequency circuit 1 in the second mode.

(6) Modifications

As for the radio-frequency circuit 1 according to the first preferred embodiment, the fourth filter 132 is a band elimination filter, for example. However, the configuration is not limited thereto. In the radio-frequency circuit 1 according to a first modification, the fourth filter 132 is a band pass filter.

Figure 4:
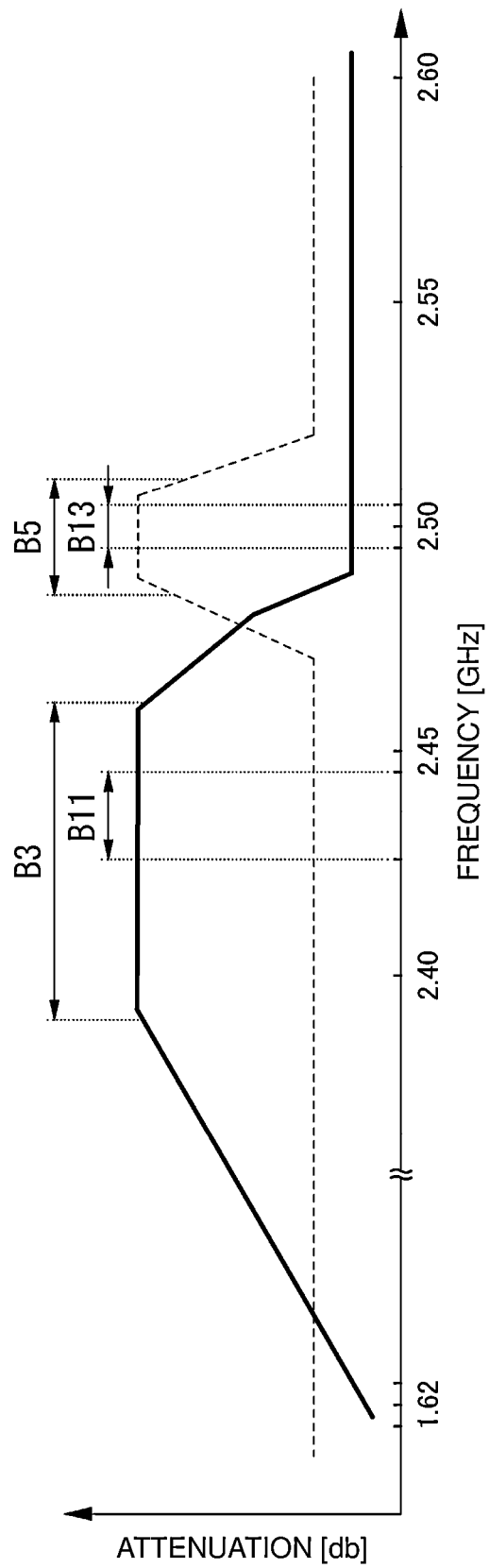
FIG. 4 shows frequency characteristic curves of a third filter and a fourth filter of a radio-frequency circuit according to a first modification of the first preferred embodiment of the present invention.

The fourth filter 132 is a band pass filter that has a fifth frequency band B5 as a pass band. As shown in FIG. 4, a portion of the third frequency band B3 that is the pass band of the third filter 131 is different from the fifth frequency band B5 that is the pass band of the fourth filter 132. In FIG. 4, the continuous line represents the frequency characteristics of the third filter 131 of the radio-frequency circuit 1 according to the first modification, and the dashed line represents the frequency characteristics of the fourth filter 132. As shown in FIG. 4, a portion of the pass band of the third filter 131 (hereinafter, referred to as "fifth available band") is not included in the fifth frequency band B5 that is the pass band of the fourth filter 132. In the radio-frequency circuit 1 according to the first modification, the first communication band B11 is included in the fifth available band. In the radio-frequency circuit 1 according to the first modification, the pass band of the third filter 131 and the pass band of the fourth filter 132 differ from each other. In the radio-frequency circuit 1, there is a frequency band (hereinafter, referred to as "sixth available band") not included in the third frequency band B3 and included in the fifth frequency band B5. In the radio-frequency circuit 1 according to the first modification, the third communication band B13 is included in the sixth communication band.

Thus, in the radio-frequency circuit 1 according to the first modification, in the second mode, a signal included in the first communication band B11 included in the fifth available band does not leak from the second input and output terminal 163. Thus, in the radio-frequency circuit 1 according to the first modification, in the second mode, a signal included in the third communication band B13 included in the sixth available band does not leak from the first input and output terminal 162. Therefore, in the radio-frequency circuit 1 according to the first modification, in the second mode, simultaneous communication using a transmission signal or a reception signal of which the carrier frequency is included in the fifth available band and a transmission signal or a reception signal of which the carrier frequency is included in the sixth available band is possible.

In the first modification as well, the bandpass characteristics of the second filter 122 and the bandpass characteristics of the fourth filter 132 are not completely the same. In other words, there is a frequency band included in the second frequency band B2 and not included in the fifth frequency band B5. Thus, the flexibility of combinations of two signals with different frequencies that the radio-frequency circuit 1 is allowed to perform simultaneous communication improves.

Therefore, even when the fourth filter 132 is a band pass filter as well, a radio-frequency circuit including similar advantageous effects to those of the radio-frequency circuit 1 according to the first preferred embodiment is implemented.

Second Preferred Embodiment

A radio-frequency circuit 1a according to a second preferred embodiment will be described with reference to FIG. 5. Regarding the radio-frequency circuit 1a according to the second preferred embodiment, like signals denote component elements similar to those of the radio-frequency circuit 1 according to the first preferred embodiment, and the description is omitted.

The radio-frequency circuit 1a according to the second preferred embodiment differs from the radio-frequency circuit 1 according to the first preferred embodiment in that a fifth filter 17, a sixth filter 18, a seventh filter 19, and a third input and output terminal 164 are provided. The radio-frequency circuit 1a according to the second preferred embodiment differs from the radio-frequency circuit 1 according to the first preferred embodiment in that a second filter 122a is provided instead of the second filter 122.

(1) Configuration

Figure 5:
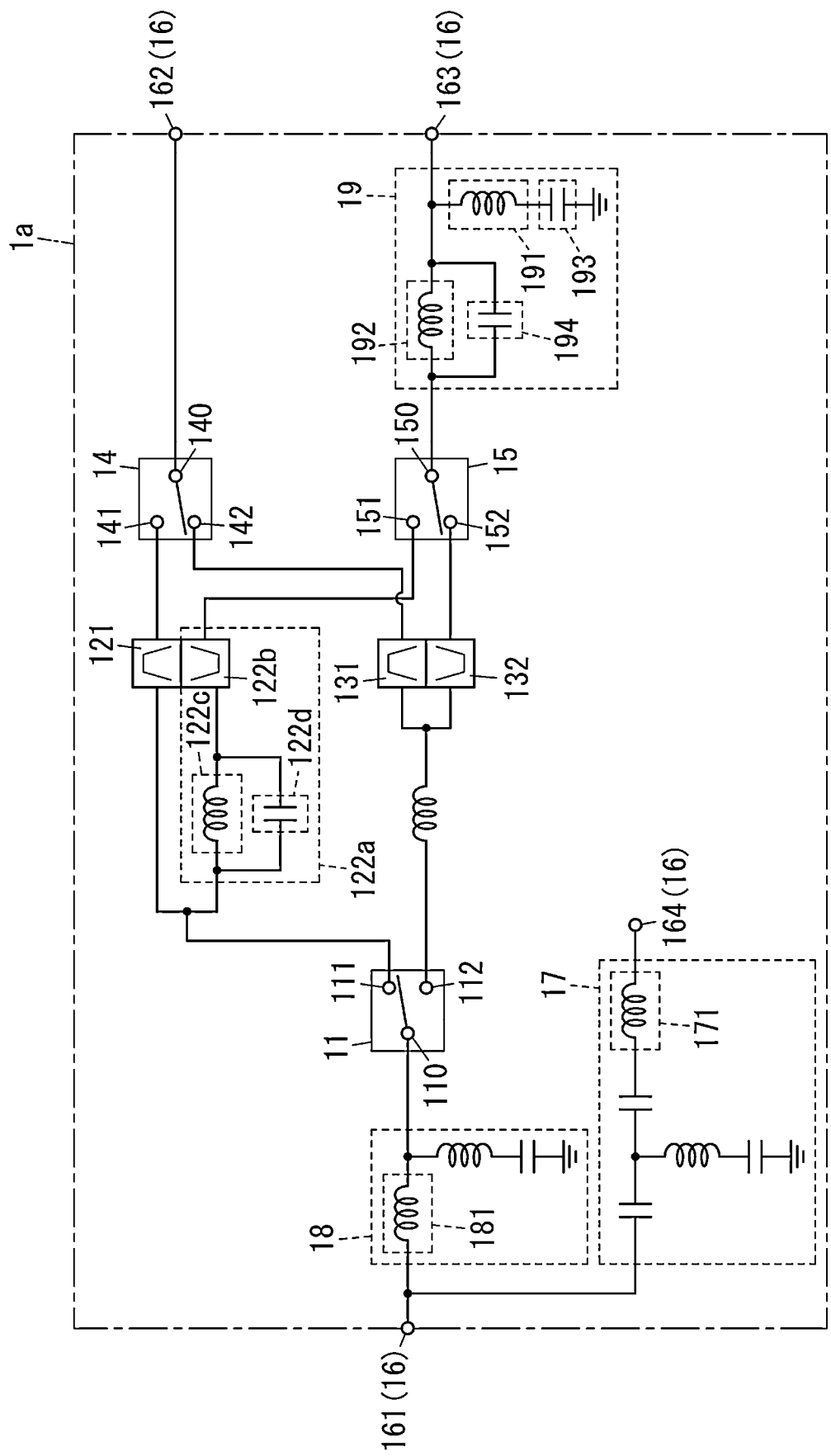
FIG. 5 is a circuit configuration diagram that shows a radio-frequency circuit according to a second preferred embodiment of the present invention.

As shown in FIG. 5, the radio-frequency circuit 1a according to the second preferred embodiment includes the first switch 11, the first filter 121, the second filter 122a, the third filter 131, the fourth filter 132, the second switch 14, and the third switch 15. The radio-frequency circuit 1a further includes the fifth filter 17, the sixth filter 18, the seventh filter 19, and the plurality of (four in the illustrated example) external connection terminals 16. The plurality of external connection terminals 16 includes the antenna terminal 161, the first input and output terminal 162, the second input and output terminal 163, and the third input and output terminal 164.

(1.1) Fifth Filter and Sixth Filter

The fifth filter 17 and the sixth filter 18 are filters that respectively pass signals in frequency bands different from each other. More specifically, the sixth filter 18 is a low-pass filter (LPF) that has a sixth frequency band at least including the first communication band B11, the second communication band B12, and the third communication band B13 as a pass band. The fifth filter 17 is a high-pass filter (HPF) that has a seventh frequency band not overlapping the sixth frequency band as a pass band.

The sixth filter 18 is not limited to a low-pass filter as long as a filter has the sixth frequency band as a pass band and the seventh frequency band as a rejection band, and may be a band pass filter or a band elimination filter. Similarly, the fifth filter 17 is not limited to a high-pass filter as long as a filter has the seventh frequency band as a pass band and the sixth frequency band as a rejection band, and may be a band pass filter or a band elimination filter.

The fifth filter 17 is connected between the antenna terminal 161 and the third input and output terminal 164. The sixth filter 18 is connected between the antenna terminal 161 and the common terminal 110 of the first switch 11.

(1.2) Seventh Filter

The seventh filter 19 is connected between the common terminal 150 of the third switch 15 and the second input and output terminal 163. The seventh filter 19 includes inductors 191, 192 and capacitors 193, 194. The first end of the inductor 192 is connected to the common terminal 150 of the third switch 15. The second end of the inductor 192 is connected to the second input and output terminal 163. The first end of the capacitor 194 is connected to the first end of the inductor 192, and the second end of the capacitor 194 is connected to the second end of the inductor 192. The first end of the inductor 191 is connected to the second end of the inductor 192 and the second input and output terminal 163. The second end of the inductor 191 is connected to the first end of the capacitor 193. The second end of the capacitor 193 is connected to a ground.

(1.3) Second Filter

Figure 6:
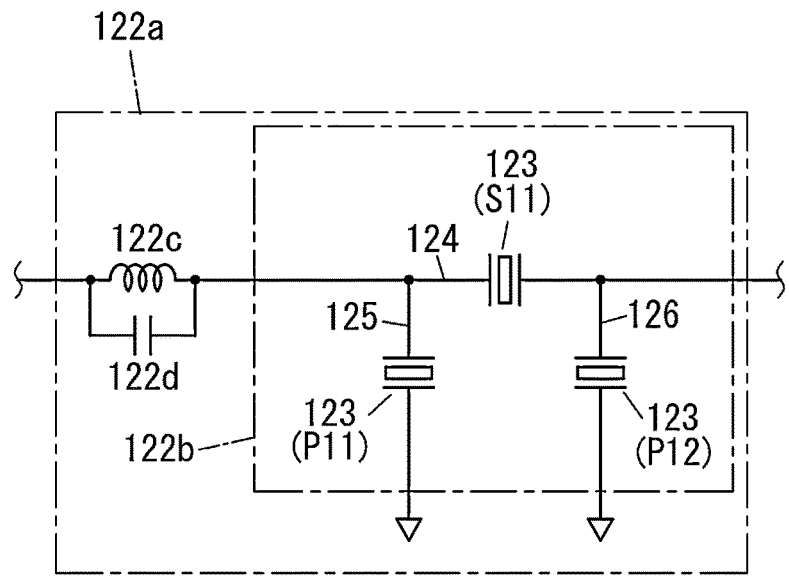
FIG. 6 is a circuit diagram of a second filter in the above radio-frequency circuit.

As shown in FIG. 5, the second filter 122a includes an acoustic wave filter 122b, an inductor 122c, and a capacitor 122d. As shown in FIG. 6, the acoustic wave filter 122b includes at least one (three in the illustrated example) acoustic wave resonator 123. The acoustic wave filter 122b, as well as the second filter 122 according to the first preferred embodiment, is an acoustic wave filter.

The acoustic wave filter 122b is, for example, a n filter. The acoustic wave filter 122b preferably includes three acoustic wave resonators 123, for example. The three acoustic wave resonators 123 include one series arm resonator S11 and two parallel arm resonators P11, P12. The series arm resonator S11 is provided in a series arm path 124 that connects the selection terminal 111 of the first switch 11 with the selection terminal 151 of the third switch 15. The parallel arm resonator P11 is provided in a parallel arm path 125 between the ground and a path between the selection terminal 111 of the first switch 11 and the series arm resonator S11 in the series arm path 124. The parallel arm resonator P12 is provided in a parallel arm path 126 between the ground and a path between the selection terminal 151 of the third switch 15 and the series arm resonator S11 in the series arm path 124.

As shown in FIG. 5, the inductor 122c is connected between the selection terminal 111 of the first switch 11 and the acoustic wave filter 122b. More specifically, the inductor 122c is connected in series with the acoustic wave filter 122b. The capacitor 122d is connected in parallel with the inductor 122c connected in series with the acoustic wave filter 122b. In other words, a "hybrid filter" is a filter that includes an acoustic wave filter including at least one acoustic wave resonator, at least one capacitor, and at least one inductor. The pass band width of the second filter 122a that is a hybrid filter is wider than the pass band width of the acoustic wave filter 122b.

(1.4) External Connection Terminal

The external connection terminals 16 are terminals to electrically connect with an external circuit (for example, the signal processing circuit 2). The plurality of external connection terminals 16 further include the third input and output terminal 164 in addition to the antenna terminal 161, the first input and output terminal 162, and the second input and output terminal 163.

The third input and output terminal 164 is a terminal to input a transmission signal from a third external circuit (for example, the signal processing circuit 2) to the radio-frequency circuit 1a or output a reception signal from the radio-frequency circuit 1 to the third external circuit. In the radio-frequency circuit 1a, the third input and output terminal 164 is connected to the fifth filter 17.

(2) Structure of Radio-Frequency Circuit (Radio-Frequency Module)

Figure 7:
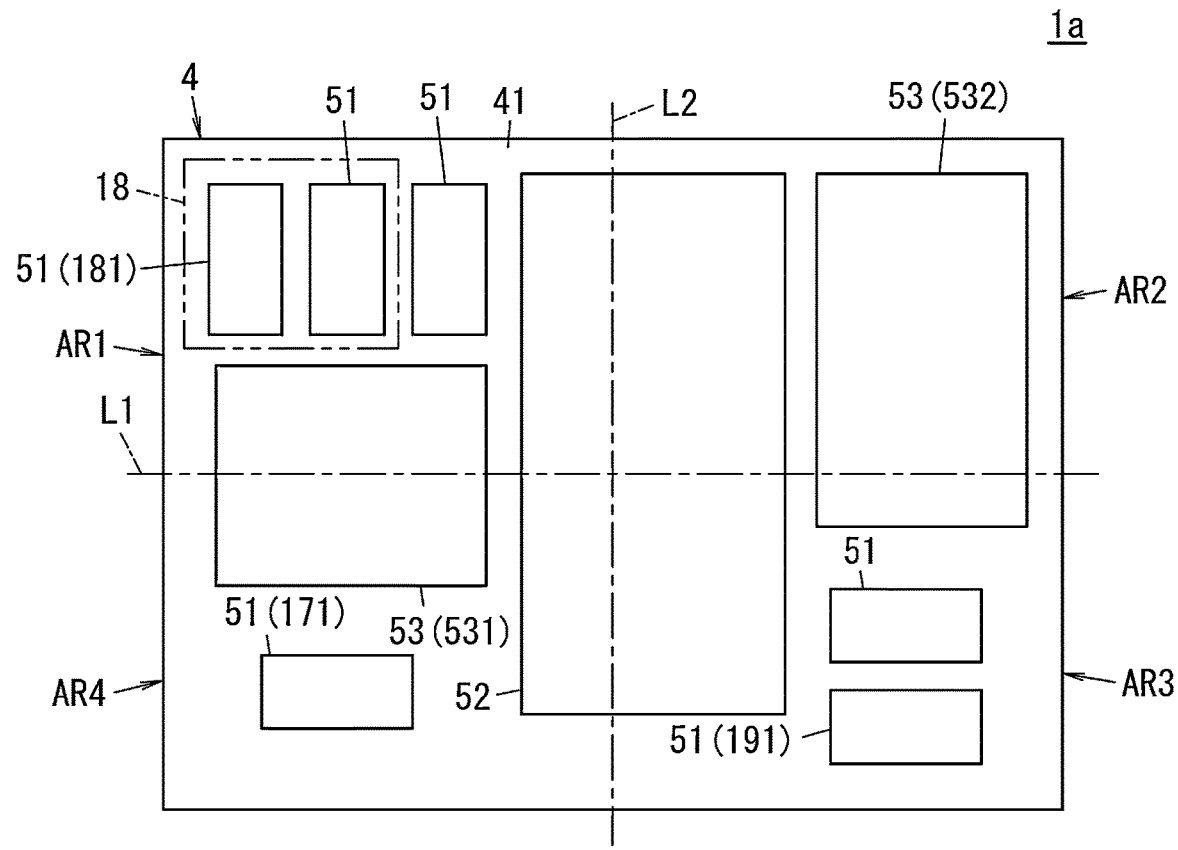
FIG. 7 is a plan view of the above radio-frequency circuit.
Figure 8:
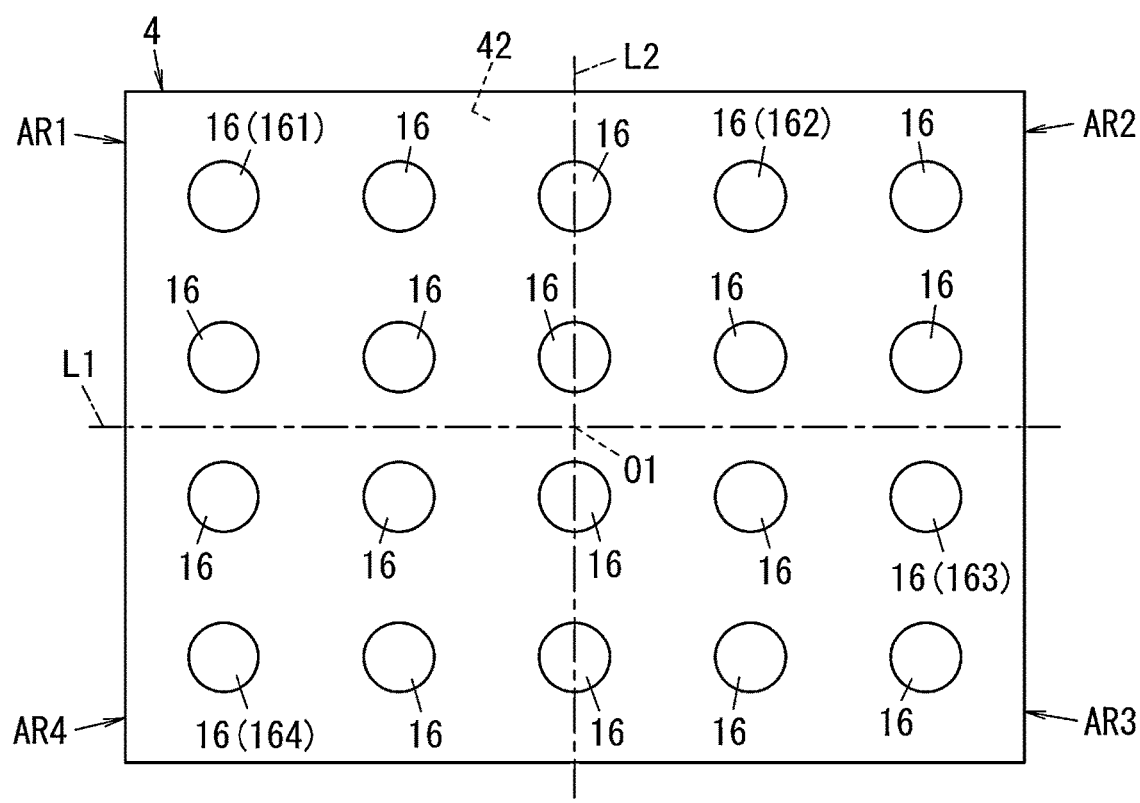
FIG. 8 relates to the above radio-frequency circuit and is a plan view that shows a second major surface of a mounting substrate and a plurality of external connection terminals disposed on the second major surface of the mounting substrate when seen through from a first major surface side of the mounting substrate.

As shown in FIGS. 7 and 8, the radio-frequency circuit 1a according to the second preferred embodiment includes the mounting substrate 4. Hereinafter, the radio-frequency circuit 1a including the mounting substrate 4 may be referred to as "radio-frequency module 1a". Hereinafter, the structure of the radio-frequency module 1a according to the second preferred embodiment will be described with reference to FIGS. 7 and 8.

As shown in FIGS. 7 and 8, the radio-frequency module 1*a* according to the second preferred embodiment includes the mounting substrate 4, a plurality of (six in the illustrated example) first electronic components 51, a second electronic component 52, a plurality of (two in the illustrated example) third electronic components 53, and the plurality of external connection terminals 16. The radio-frequency module 1*a* further includes a resin layer (not shown) and a metal layer (not shown).

The radio-frequency module 1*a* can be electrically connected to an external substrate (not shown). The external substrate corresponds to, for example, a mother substrate of the communication device 10 (see FIG. 2), such as a cellular phone and communication equipment. A state where the radio-frequency module 1*a* can be electrically connected to an external substrate includes not only a case where the radio-frequency module 1*a* is directly mounted on the external substrate but also a case where the radio-frequency module 1*a* is indirectly mounted on the external substrate. The case where the radio-frequency module 1*a* is indirectly mounted on the external substrate is, for example, a case where the radio-frequency module 1*a* is mounted on another radio-frequency module mounted on the external substrate.

(2.1) Mounting Substrate

As shown in FIGS. 7 and 8, the mounting substrate 4 includes a first major surface 41 and a second major surface 42. The first major surface 41 and the second major surface 42 are opposite to each other in the thickness direction of the mounting substrate 4. The second major surface 42 is opposite to the mounting substrate 4-side major surface of the external substrate when the radio-frequency circuit 1 is provided on the external substrate. The mounting substrate 4 is, for example, a one-side mounting substrate in which a plurality of electronic components is mounted on the first major surface 41.

The mounting substrate 4 is a multilayer substrate in which a plurality of dielectric layers is laminated. The mounting substrate 4 includes a plurality of electrically conductive layers and a plurality of via conductors (including through vias). The plurality of electrically conductive layers includes a ground layer including a ground potential. The plurality of via conductors is used in electrical connection between elements (including the first electronic component 51, the second electronic component 52, and the third electronic component 53) mounted on the first major surface 41 and the electrically conductive layers of the mounting substrate 4. The plurality of via conductors is used in electrical connection between the electrically conductive layers of the mounting substrate 4 and the external connection terminals 16.

(2.2) First Electronic Component

As shown in FIG. 7, the plurality of first electronic components 51 is disposed on the first major surface 41 of the mounting substrate 4. Each of the plurality of first electronic components 51 is an inductor.

(2.3) Second Electronic Component

As shown in FIG. 7, the second electronic component 52 is disposed on the first major surface 41 of the mounting substrate 4. The second electronic component 52 is an acoustic wave filter that includes a plurality of series arm resonators and a plurality of parallel arm resonators. Each of the acoustic wave filters is, for example, a surface acoustic wave (SAW) filter that uses surface acoustic waves. In the radio-frequency module 1*a* according to the second preferred embodiment, the second electronic component 52 includes the first filter 121, the third filter 131, the fourth filter 132, and the acoustic wave filter 122*b* of the second filter 122*a*.

(2.4) Third Electronic Component

As shown in FIG. 7, the plurality of third electronic components 53 is disposed on the first major surface 41 of the mounting substrate 4. Each of the plurality of third electronic components 53 is any one of a first IC chip 531 and a second IC chip 532.

The first IC chip 531 at least includes the first switch 11. The first IC chip 531 may include at least one of an inductor and a capacitor connected between the antenna terminal 161 and the common terminal 110 of the first switch 11. The first IC chip 531 may include at least one of an inductor and a capacitor connected between the antenna terminal 161 and the third input and output terminal 164.

The second IC chip 532 at least includes the second switch 14 and the third switch 15. The second IC chip 532 may include at least one of an inductor and a capacitor, which is a component of the seventh filter 19.

(2.5) External Connection Terminal

The plurality of external connection terminals 16 are terminals to electrically connect the mounting substrate 4 with an external substrate (not shown).

As shown in FIG. 8, the plurality of external connection terminals 16 is disposed on the second major surface 42 of the mounting substrate 4. The plurality of external connection terminals 16 is columnar (or cylindrical) electrodes provided on the second major surface 42 of the mounting substrate 4. The material of the plurality of external connection terminals 16 is, for example, metal (for example, copper, copper alloy, or the like). The plurality of external connection terminals 16 may be, for example, ball electrodes made of solder or the like.

The plurality of external connection terminals 16 includes the antenna terminal 161, the first input and output terminal 162, the second input and output terminal 163, and the third input and output terminal 164. The antenna terminal 161, the first input and output terminal 162, the second input and output terminal 163, and the third input and output terminal 164 are disposed on the second major surface 42 of the mounting substrate 4 so as not to be located in the same regions AR1 to AR4. In the radio-frequency module 1*a* according to the second preferred embodiment, the antenna terminal 161 is disposed in the region AR1. The first input and output terminal 162 is disposed in the region AR2. The second input and output terminal 163 is disposed in the region AR3. The third input and output terminal is disposed in the region AR4.

(3) Detailed Structure of Each Component Element of Radio-Frequency Circuit (Radio-Frequency Module)

(3.1) Mounting Substrate

The mounting substrate 4 shown in FIGS. 7 and 8 is, for example, a multilayer substrate that includes a plurality of dielectric layers and a plurality of electrically conductive layers. The plurality of dielectric layers and the plurality of electrically conductive layers are laminated in the thickness direction of the mounting substrate 4. The plurality of electrically conductive layers each is formed in a predetermined pattern determined layer by layer. Each of the plurality of electrically conductive layers includes one or more conductor portions in a plane orthogonal to the thickness direction of the mounting substrate 4. The material of each electrically conductive layer is, for example, copper. The plurality of electrically conductive layers includes a ground layer. In the radio-frequency module 1*a*, the plurality of ground terminals and the ground layer are electrically connected with a via conductor or the like of the mounting substrate 4, interposed therebetween. The mounting substrate 4 is, for example, a low temperature co-fired ceramics (LTCC) substrate. The mounting substrate 4 is not limited to an LTCC substrate. The mounting substrate 4 may be, for example, a printed circuit board, a high temperature co-fired ceramics (HTCC) substrate, or a resin multilayer substrate.

The mounting substrate 4 is not limited to an LTCC substrate and may be, for example, a wiring structure. The wiring structure is, for example, a multilayer structure. The multilayer structure includes at least one electrically insulating layer and at least one electrically conductive layer. The electrically insulating layer is formed in a predetermined pattern. When the number of the electrically insulating layers is multiple, each of the multiple electrically insulating layers is formed in a predetermined pattern determined layer by layer. The electrically conductive layer is formed in a predetermined pattern different from the predetermined pattern of the electrically insulating layer. When the number of the electrically conductive layers is multiple, each of the multiple electrically conductive layers is formed in a predetermined pattern determined layer by layer. The electrically conductive layer may include one or more rewiring portions. In the wiring structure, of two surfaces facing each other in the thickness direction of the multilayer structure, a first surface is the first major surface 41 of the mounting substrate 4, and a second surface is the second major surface 42 of the mounting substrate 4. The wiring structure may be, for example, an interposer. The interposer may include a silicon substrate or may be a substrate made up of multiple layers.

The first major surface 41 and the second major surface 42 of the mounting substrate 4 are spaced apart in the thickness direction of the mounting substrate 4 and intersect with the thickness direction of the mounting substrate 4. The first major surface 41 of the mounting substrate 4 is, for example, orthogonal to the thickness direction of the mounting substrate 4. The first major surface 41 may include, for example, the side surface or the like of the conductor portion as a surface not orthogonal to the thickness direction of the mounting substrate 4. The second major surface 42 of the mounting substrate 4 is, for example, orthogonal to the thickness direction of the mounting substrate 4. The first major surface 41 may include, for example, the side surface or the like of the conductor portion as a surface not orthogonal to the thickness direction of the mounting substrate 4. The first major surface 41 and the second major surface 42 of the mounting substrate 4 may have minute irregularities or a recessed portion or a protruding portion.

(3.2) Second Electronic Component

The second electronic component 52 including an acoustic wave filter includes, for example, a substrate and a circuit portion formed on the substrate. The substrate has a first surface and a second surface opposite to each other in a thickness direction of the substrate. The substrate is, for example, a piezoelectric substrate. The piezoelectric substrate is, for example, a lithium niobate substrate, a lithium tantalate substrate, or a quartz crystal substrate. The circuit portion has a plurality of interdigital transducer electrodes in a one-to-one correspondence with a plurality of series arm resonators and a plurality of interdigital transducer electrodes in a one-to-one correspondence with a plurality of parallel arm resonators. The second electronic component 52 is, for example, flip-chip mounted on the first major surface 41 of the mounting substrate 4 such that the first surface of the substrate is on the first major surface 41 side of the mounting substrate 4. In plan view in the thickness direction of the mounting substrate 4, the outer edge of the second electronic component 52 has a rectangular or substantially rectangular shape.

(3.3) First IC Chip

The first IC chip 531 including the first switch 11 is, for example, a single-chip IC that includes a substrate and a circuit portion. The substrate includes a first surface and a second surface opposite to each other in a thickness direction of the substrate. The substrate is, for example, a silicon substrate. The circuit portion includes a plurality of FETs as a plurality of switching elements.

Figure 9:
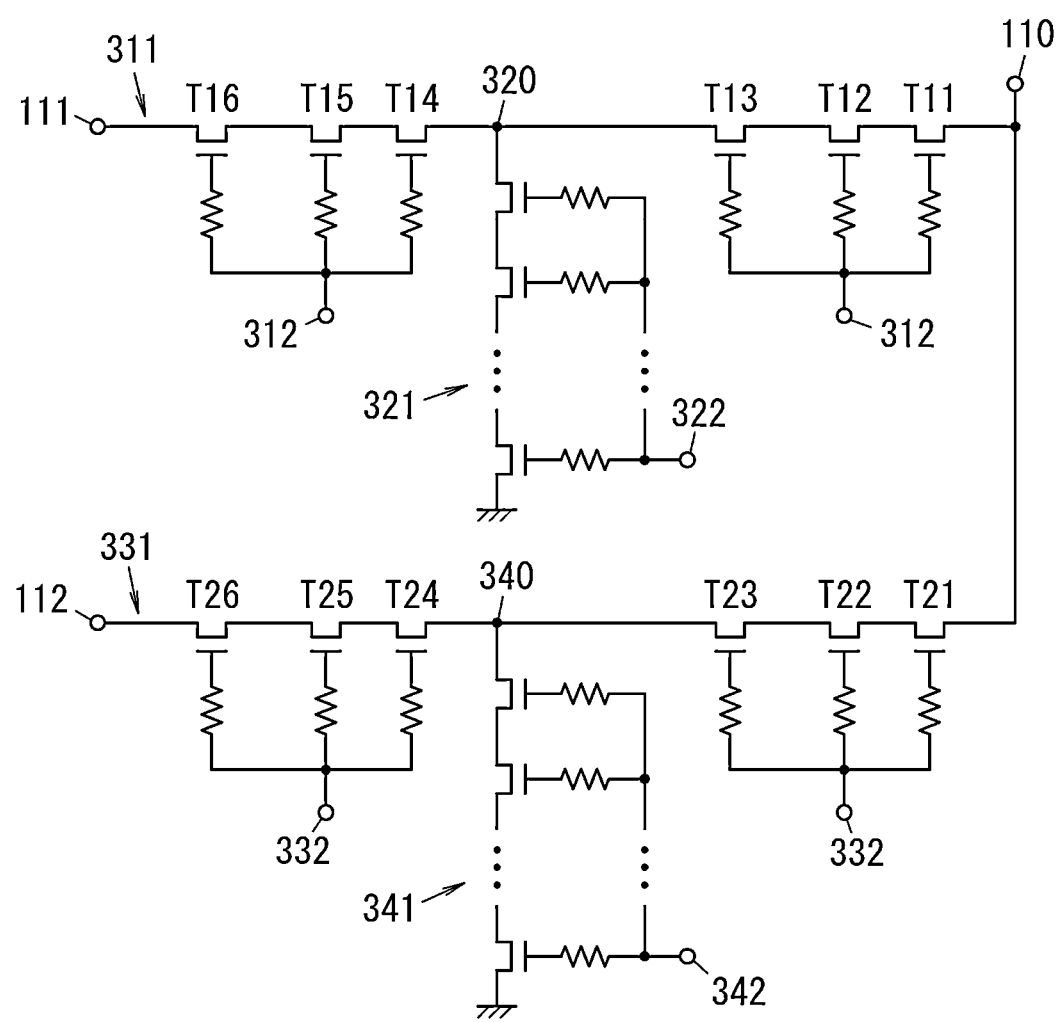
FIG. 9 is a circuit configuration diagram of a first switch in the above radio-frequency circuit.

FIG. 9 shows a circuit diagram of the first switch 11 included in the first IC chip 531. As shown in FIG. 9, the first switch 11 includes a plurality of (two in the illustrated example) combinations of two circuits. More specifically, the first switch 11 includes a first circuit 311 and a third circuit 321. The first switch 11 further includes a second circuit 331 and a fourth circuit 341.

The first circuit 311 includes a plurality of (six in the illustrated example) switching elements T11 to T16 connected in series. Each of the switching elements T11 to T16 is, for example, a field effect transistor (FET). The second circuit 331 includes a plurality of (six in the illustrated example) switching elements T21 to T26 connected in series. Each of the switching elements T21 to T26 is an FET. The third circuit 321 includes a plurality of switching elements connected in series. The fourth circuit 341 includes a plurality of switching elements connected in series. Each of the switching elements of the third circuit 321 and the fourth circuit 341 is, for example, an FET.

The first end of the first circuit 311 is connected to the common terminal 110, and the second end of the first circuit 311 is connected to the selection terminal 111. The first end of the second circuit 331 is connected to the common terminal 110, and the second end of the second circuit 331 is connected to the selection terminal 112. In the radio-frequency circuit 1 according to the second preferred embodiment, each of the first circuit 311 and the second circuit 331 is a first switching circuit. The third circuit 321 is connected between the ground and a path that connects the common terminal 110 and the selection terminal 111 in the first circuit 311. More specifically, the third circuit 321 is connected between the ground and a path 320 between the switching element T13 and the switching element T14 in the above path. The fourth circuit 341 is connected between the ground and a path that connects the common terminal 110 and the selection terminal 112 in the second circuit 331. More specifically, the fourth circuit 341 is connected between the ground and a path 340 between the switching element T23 and the switching element T24 in the above path.

A control terminal (gate terminal) of each of the switching elements T11 to T16 included in the first circuit 311 is connected to a single control input 312. A control terminal (gate terminal) of each of the switching elements T21 to T26 included in the second circuit 331 is connected to a single control input 332. A control terminal (gate terminal) of each of the switching elements included in the third circuit 321 is connected to a single control input 322. A control terminal (gate terminal) of each of the switching elements included in the fourth circuit 341 is connected to a single control input 342. In other words, each of the first circuit 311, the second circuit 331, the third circuit 321, and the fourth circuit 341 functions as a single switch.

The first switch 11 is controlled as follows. In other words, when the common terminal 110 is connected to the selection terminal 111, both the control inputs 312, 342 are controlled to on, and both the control inputs 332, 322 are controlled to off. Thus, the second circuit 331 is set to an off state, and the fourth circuit 341 is set to an on state, so the selection terminal 112 is isolated from the common terminal 110 and the selection terminal 111. The third circuit 321 is set to an off state, and the first circuit 311 is set to an on state, so the common terminal 110 and the selection terminal 111 are connected with the first circuit 311 interposed therebetween. Both a signal that passes through the first filter 121 and a signal that passes through the second filter 122*a* pass through the first circuit 311. Therefore, preferably, the number of switching elements included in the first circuit 311 is greater than the number of switching elements of a fifth circuit 351 (see FIG. 10) of the second switch 14 and is greater than the number of switching elements of a fifth circuit (not shown) of the third switch 15. In the radio-frequency circuit 1*a* according to the second preferred embodiment, the number of switching elements connected in series in the first switching circuit is six, for example.

Similarly, when the common terminal 110 is connected to the selection terminal 112, both the control inputs 332, 322 are controlled to on, and both the control inputs 312, 342 are controlled to off. Thus, the first circuit 311 is set to an off state, the third circuit 321 is set to an on state, the second circuit 331 is set to an on state, and the fourth circuit 341 is set to an off state. Therefore, the common terminal 110 and the selection terminal 112 are connected with the second circuit 331 interposed therebetween. Both a signal that passes through the third filter 131 and a signal that passes through the fourth filter 132 pass through the second circuit 331. Therefore, preferably, the number of switching elements included in the second circuit 331 is greater than the number of switching elements of a sixth circuit 371 (see FIG. 10) of the second switch 14 and is greater than the number of switching elements of a sixth circuit (not shown) of the third switch 15. In the radio-frequency circuit 1*a* according to the second preferred embodiment, the number of switching elements connected in series in the first switching circuit is six, for example.

Each of the plurality of switching elements is not limited to an FET and may be, for example, a bipolar transistor.

The first IC chip 531 is flip-chip mounted on the first major surface 41 of the mounting substrate 4 such that the first surface of the substrate is on the first major surface 41 side of the mounting substrate 4. In plan view in the thickness direction of the mounting substrate 4, the outer edge of the first IC chip 531 has a rectangular or substantially rectangular shape.

(3.4) Second IC Chip

The second IC chip 532 including the second switch 14 and the third switch 15 is, for example, a single-chip IC that includes a substrate and a circuit portion. The substrate has a first surface and a second surface opposite to each other in a thickness direction of the substrate. The substrate is, for example, a silicon substrate. The circuit portion includes a plurality of FETs as a plurality of switching elements.

Figure 10:
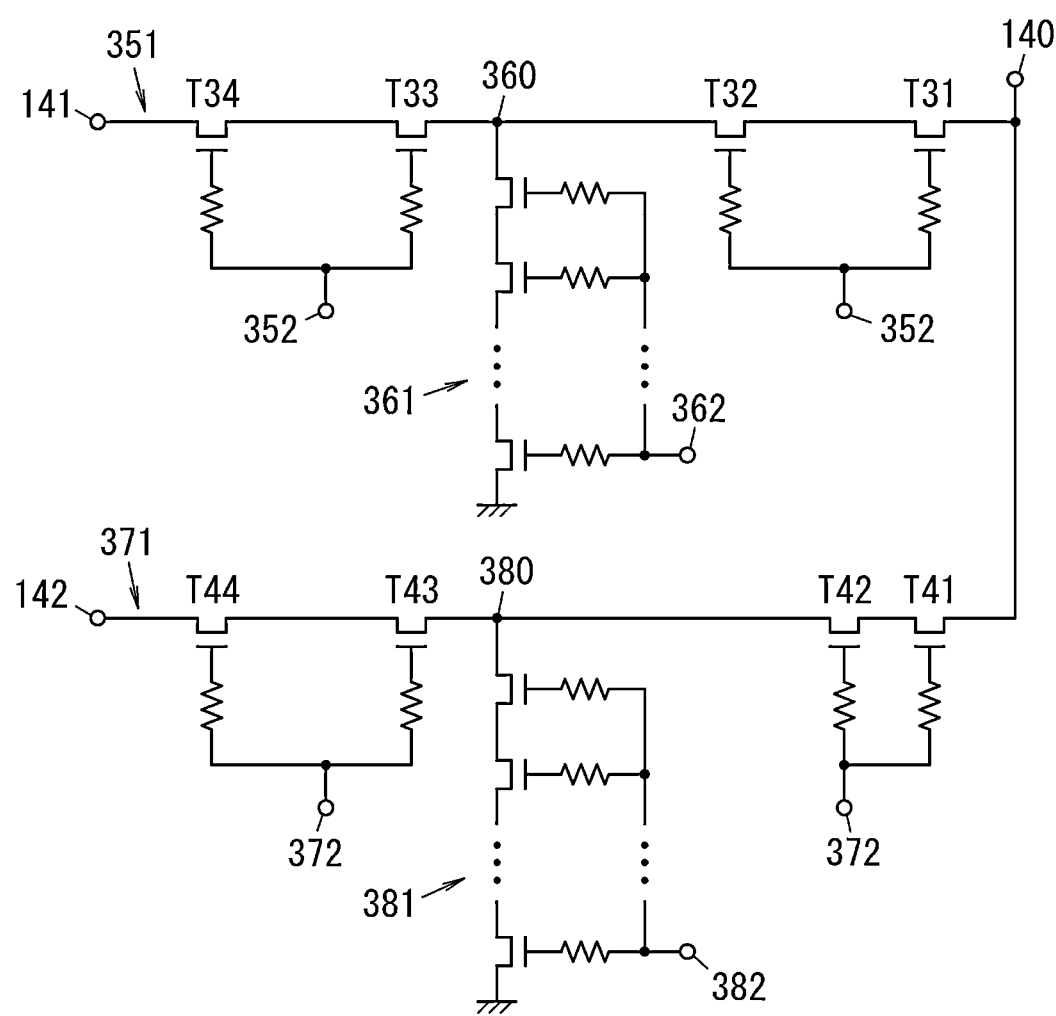
FIG. 10 is a circuit configuration diagram of a second switch and a third switch in the above radio-frequency circuit.

FIG. 10 shows a circuit diagram of the second switch 14 included in the second IC chip 532. As shown in FIG. 10, the second switch 14 includes the plurality of (two in the illustrated example) fifth circuits 351, the sixth circuit 371, a plurality of (two in the illustrated example) seventh circuits 361, and an eighth circuit 381.

The fifth circuit 351 includes a plurality of (four in the illustrated example) switching elements T31 to T34 connected in series. Each of the switching elements T31 to T34 is an FET. The sixth circuit 371 includes a plurality of (four in the illustrated example) switching elements T41 to T44 connected in series. Each of the switching elements T41 to T44 is an FET. The seventh circuit 361 includes a plurality of switching elements connected in series. The eighth circuit 381 includes a plurality of switching elements connected in series. Each of the switching elements of the seventh circuit 361 and the eighth circuit 381 is, for example, an FET.

The first end of the fifth circuit 351 is connected to the common terminal 140, and the second end of the fifth circuit 351 is connected to the selection terminal 141. The first end of the sixth circuit 371 is connected to the common terminal 140, and the second end of the sixth circuit 371 is connected to the selection terminal 142. In the radio-frequency circuit 1 according to the second preferred embodiment, each of the fifth circuit 351 and the sixth circuit 371 is a second switching circuit. The seventh circuit 361 is connected between the ground and a path that connects the common terminal 140 and the selection terminal 141 in the fifth circuit 351. More specifically, the seventh circuit 361 is connected between the ground and a path 360 between the switching element T32 and the switching element T33 in the above path. The eighth circuit 381 is connected between the ground and a path that connects the common terminal 140 and the selection terminal 142 in the sixth circuit 371. More specifically, the eighth circuit 381 is connected between the ground and a path 380 between the switching element T42 and the switching element T43 in the above path.

A control terminal (gate terminal) of each of the switching elements T31 to T34 included in the fifth circuit 351 is connected to a single control input 352. A control terminal (gate terminal) of each of the switching elements T41 to T44 included in the sixth circuit 371 is connected to a single control input 372. A control terminal (gate terminal) of each of the switching elements included in the seventh circuit 361 is connected to a single control input 362. A control terminal (gate terminal) of each of the switching elements included in the eighth circuit 381 is connected to a single control input 382. In other words, each of the fifth circuit 351, the sixth circuit 371, the seventh circuit 361, and the eighth circuit 381 functions as a single switch.

The second switch 14 is controlled as follows. In other words, when the common terminal 140 is connected to the selection terminal 141, both the control inputs 352, 382 are controlled to on, and both the control inputs 372, 362 are controlled to off. Thus, the fifth circuit 351 is set to an on state, the seventh circuit 361 is set to an off state, the sixth circuit 371 is set to an off state, and the eighth circuit 381 is set to an on state. Therefore, the common terminal 140 and the selection terminal 141 are connected with the fifth circuit 351 interposed therebetween.

Similarly, when the common terminal 140 is connected to the selection terminal 142, both the control inputs 372, 362 are controlled to on, and both the control inputs 352, 382 are controlled to off. Thus, the fifth circuit 351 is set to an off state, the seventh circuit 361 is set to an on state, the sixth circuit 371 is set to an on state, and the eighth circuit 381 is set to an off state. Therefore, the common terminal 140 and the selection terminal 142 are connected with the sixth circuit 371 interposed therebetween.

The configuration of the third switch 15 is the same as the configuration of the above-described second switch 14.

A signal that passes through the fifth circuit 351 of the second switch and a signal that passes through the fifth circuit (not shown) of the third switch pass through the first circuit 311 (see FIG. 9) of the first switch 11 at the same time. A signal that passes through the sixth circuit 371 of the second switch and a signal that passes through the sixth circuit (not shown) of the third switch pass through the second circuit 331 (see FIG. 9) of the first switch 11 at the same time. Therefore, an electric power that passes through the first switch 11 is larger than each of an electric power that passes through the second switch 14 and an electric power that passes through the third switch 15. In other words, an electric power that passes through the second switch 14 is smaller than an electric power that passes through the first switch 11. Therefore, the number of switching elements included in each of the fifth circuit 351 and the sixth circuit 371 may be less than the number of switching circuits of each of the first circuit 311 and the second circuit 331 of the first switch 11. In the radio-frequency circuit 1a according to the second preferred embodiment, the number of switching elements connected in series in the first switching circuit is four, for example.

Each of the plurality of switching elements is not limited to an FET and may be, for example, a bipolar transistor.

The second IC chip 532 is flip-chip mounted on the first major surface 41 of the mounting substrate 4 such that the first surface of the substrate is on the first major surface 41 side of the mounting substrate 4. In plan view in the thickness direction of the mounting substrate 4, the outer edge of the second IC chip 532 has a rectangular or substantially rectangular shape.

(4) Layout of Radio-Frequency Circuit (4.1) Layout of External Connection Terminals Initially, the layout of the external connection terminals 16 (the antenna terminal 161, the first input and output terminal 162, the second input and output terminal 163, and the third input and output terminal 164) will be described with reference to FIG. 8.

The radio-frequency circuit 1a according to the second preferred embodiment, as described above, is capable of performing simultaneous communication using a transmission signal or a reception signal input to or output from the radio-frequency circuit 1a through the first input and output terminal 162, a transmission signal or a reception signal input to or output from the radio-frequency circuit 1a through the second input and output terminal 163, and a transmission signal or a reception signal input to or output from the radio-frequency circuit 1a through the third input and output terminal 164, with carrier frequencies different from one another.

In the radio-frequency circuit 1a according to the second preferred embodiment, as shown in FIG. 8, the second major surface 42 of the mounting substrate 4 includes the four regions AR1 to AR4. The four regions AR1 to AR4 are partitioned by two imaginary straight lines L1, L2. More specifically, the region AR1 and the region AR4 are opposite to each other and the region AR2 and the region AR3 are opposite to each other in a direction orthogonal to the imaginary straight line L1. The region AR1 and the region AR2 are opposite to each other and the region AR3 and the region AR4 are opposite to each other in a direction orthogonal to the imaginary straight line L2. The imaginary straight line L1 and the imaginary straight line L2 are orthogonal to each other and intersect with each other at a center O1 of the second major surface 42 of the mounting substrate 4. More specifically, the second major surface 42 of the mounting substrate 4 has a rectangular or substantially rectangular shape in plan view in the thickness direction of the mounting substrate 4, the imaginary straight line L1 is parallel or substantially parallel to the long sides of the second major surface 42, and the imaginary straight line L2 is parallel or substantially parallel to the short sides of the second major surface 42.

In the radio-frequency circuit 1a according to the second preferred embodiment, only any one of the antenna terminal 161, the first input and output terminal 162, the second input and output terminal 163, and the third input and output terminal 164 is disposed in each of the regions AR1 to AR4. In the radio-frequency module 1a according to the second preferred embodiment, as shown in FIG. 8, the antenna terminal 161 is disposed in the region AR1. The first input and output terminal 162 is disposed in the region AR2. The second input and output terminal 163 is disposed in the region AR3. The third input and output terminal 164 is disposed in the region AR4.

(4.2) Layout of Electronic Components

In the radio-frequency circuit 1a according to the second preferred embodiment, electronic components connected to the antenna terminal 161, the first input and output terminal 162, the second input and output terminal 163, and the third input and output terminal 164 are disposed at locations that overlap the regions AR1 to AR4 in which the external connection terminals 16 connected to the electronic components are present in plan view in the thickness direction of the mounting substrate 4.

As described above, the antenna terminal 161 is disposed in the region AR1 on the second major surface 42 of the mounting substrate 4. Therefore, the electronic components connected to the antenna terminal 161 are disposed at locations that overlap the region AR1 in plan view in the thickness direction of the mounting substrate 4. In the radio-frequency circuit 1a according to the second preferred embodiment, the antenna terminal 161 is connected to an inductor 181 of the sixth filter 18. In other words, in the radio-frequency circuit 1a according to the second preferred embodiment, as shown in FIG. 7, the inductor 181 is disposed at a location that overlaps the region AR1 in plan view in the thickness direction of the mounting substrate 4.

Similarly, the first input and output terminal 162 is disposed in the region AR2 on the second major surface 42 of the mounting substrate 4. Therefore, the electronic components connected to the first input and output terminal 162 are disposed at locations that overlap the region AR2 in plan view in the thickness direction of the mounting substrate 4. In the radio-frequency circuit 1a according to the second preferred embodiment, the first input and output terminal 162 is connected to the common terminal 140 of the second switch 14. In other words, in the radio-frequency circuit 1a according to the second preferred embodiment, as shown in FIG. 7, the second IC chip 532 including the second switch 14 is disposed at a location that overlaps the region AR2 in plan view in the thickness direction of the mounting substrate 4.

Similarly, the second input and output terminal 163 is disposed in the region AR3 on the second major surface 42 of the mounting substrate 4. Therefore, the electronic components connected to the second input and output terminal 163 are disposed at locations that overlap the region AR3 in plan view in the thickness direction of the mounting substrate 4. In the radio-frequency circuit 1a according to the second preferred embodiment, the second input and output terminal 163 is connected to an inductor 191 of the seventh filter 19. In other words, in the radio-frequency circuit 1a according to the second preferred embodiment, as shown in FIG. 7, the inductor 191 is disposed at a location that overlaps the region AR3 in plan view in the thickness direction of the mounting substrate 4.

Similarly, the third input and output terminal 164 is disposed in the region AR4 on the second major surface 42 of the mounting substrate 4. Therefore, the electronic components connected to the third input and output terminal 164 are disposed at locations that overlap the region AR4 in plan view in the thickness direction of the mounting substrate 4. In the radio-frequency circuit 1a according to the second preferred embodiment, the third input and output terminal 164 is connected to an inductor 171 of the fifth filter 17. In other words, in the radio-frequency circuit 1a according to the second preferred embodiment, as shown in FIG. 7, the inductor 171 is disposed at a location that overlaps the region AR4 in plan view in the thickness direction of the mounting substrate 4.

(5) Advantageous Effects

The radio-frequency circuit 1a according to the second preferred embodiment is capable of performing simultaneous communication using a signal of which the carrier frequency is included in the first available band and a signal of which the carrier frequency is included in the second available band in the first mode.

The radio-frequency circuit 1a according to the second preferred embodiment is capable of performing simultaneous communication using a signal of which the carrier frequency is included in the third available band and a signal of which the carrier frequency is included in the fourth available band in the second mode.

In the radio-frequency circuit 1a according to the second preferred embodiment, the pass band of the first filter 121 and the pass band of the third filter 131 at least partially overlap each other. Thus, there is a carrier frequency that can be used commonly in the first mode and in the second mode for a transmission signal or a reception signal input to or output from the radio-frequency circuit 1a through the first input and output terminal 162.

In the radio-frequency circuit 1a according to the second preferred embodiment, the pass band of the first filter 121 and the pass band of the third filter 131 do not completely coincide with each other. Therefore, in the radio-frequency circuit 1a according to the second preferred embodiment, the pass band of the first filter 121 and the rejection band of the second filter 122a can be designed so as to be suitable for the operation of the radio-frequency circuit 1a in the first mode. In the radio-frequency circuit 1a according to the second preferred embodiment, the pass band of the third filter 131 and the rejection band of the fourth filter 132 can be designed so as to be suitable for the operation of the radio-frequency circuit 1a in the second mode.

In the radio-frequency circuit 1a according to the second preferred embodiment, the rejection band of the second filter 122a and the rejection band of the fourth filter 132 do not completely coincide with each other. Therefore, in the radio-frequency circuit 1a according to the second preferred embodiment, the pass band of the first filter 121 and the rejection band of the second filter 122a can be designed so as to be suitable for the operation of the radio-frequency circuit 1a in the first mode. In the radio-frequency circuit 1a according to the second preferred embodiment, the pass band of the third filter 131 and the rejection band of the fourth filter 132 are easily designed so as to be suitable for the operation of the radio-frequency circuit 1a in the second mode.

In addition, the radio-frequency circuit 1a according to the second preferred embodiment is capable of performing simultaneous communication using a transmission signal or a reception signal input to or output from the radio-frequency circuit 1a through the third input and output terminal 164 in addition to a transmission signal or a reception signal input to or output from the radio-frequency circuit 1a through the first input and output terminal 162 and a transmission signal or a reception signal input to or output from the radio-frequency circuit 1a through the second input and output terminal 163.

In addition, in the radio-frequency circuit 1a according to the second preferred embodiment, the second major surface 42 of the mounting substrate 4 includes the four regions AR1 to AR4. The four regions AR1 to AR4 are partitioned by two imaginary straight lines L1, L2. The imaginary straight line L1 and the imaginary straight line L2 are orthogonal to each other and intersect with each other at the center O1 of the second major surface 42 of the mounting substrate 4. In the radio-frequency circuit 1a according to the second preferred embodiment, only any one of the antenna terminal 161, the first input and output terminal 162, the second input and output terminal 163, and the third input and output terminal 164 is disposed in each of the regions AR1 to AR4. Therefore, isolation characteristics are increased with a signal input or output through the first input and output terminal 162, a signal input or output through the second input and output terminal 163, and a signal input or output through the third input and output terminal 164.

In addition, in the radio-frequency circuit 1a according to the second preferred embodiment, electronic components connected to the antenna terminal 161, the first input and output terminal 162, the second input and output terminal 163, and the third input and output terminal 164 are disposed at locations that overlap the regions AR1 to AR4 in which the external connection terminals 16 connected to the electronic components are present in plan view in the thickness direction of the mounting substrate 4. Thus, a wire length between each of the antenna terminal 161, the first input and output terminal 162, the second input and output terminal 163, and the third input and output terminal 164 and the electronic components disposed on the first major surface 41 of the mounting substrate 4 is reduced. In addition, a mutual distance in wire between each of the antenna terminal 161, the first input and output terminal 162, the second input and output terminal 163, and the third input and output terminal 164 and the electronic components disposed on the first major surface 41 of the mounting substrate 4 is reduced. Therefore, isolation characteristics are increased with a signal input or output through the first input and output terminal 162, a signal input or output through the second input and output terminal 163, and a signal input or output through the third input and output terminal 164.

In addition, in the radio-frequency circuit 1a according to the second preferred embodiment, in the first switch 11, the first switching circuit is provided between the common terminal 110 and each of the selection terminals 111, 112. In addition, in the radio-frequency circuit 1a according to the second preferred embodiment, in the second switch 14, the second switching circuit is provided between the common terminal 140 and each of the selection terminals 141, 142. In addition, in the radio-frequency circuit 1a according to the second preferred embodiment, in the third switch 15, the third switching circuit is provided between the common terminal 150 and each of the selection terminals 151, 152. The number of switching elements connected in series in the first switching circuit is less than the number of switching elements connected in series in the second switching circuit. Therefore, switching elements in the second switch 14 or the third switch 15 are smaller in number than those in the first switch 11 and have lower voltage withstand characteristics than switching elements in the first switch 11. On the other hand, each of an electric power that passes through the second switch 14 and an electric power that passes through the third switch is smaller than an electric power that passes through the first switch 11. Therefore, in the radio-frequency circuit 1*a* according to the second preferred embodiment, the withstand voltage characteristics of the first switch 11 are improved, while a power loss is prevented by reducing the number of switching elements of each of the second switch 14 and the third switch 15.

(6) Modifications

A radio-frequency circuit 1*b* according to a second modification of the second preferred embodiment will be described with reference to FIG. 11. Regarding the radio-frequency circuit 1*b* according to the second modification, like reference signs denote components similar to those of the radio-frequency circuit 1*a* according to the second preferred embodiment, and the description is omitted.

Figure 11:
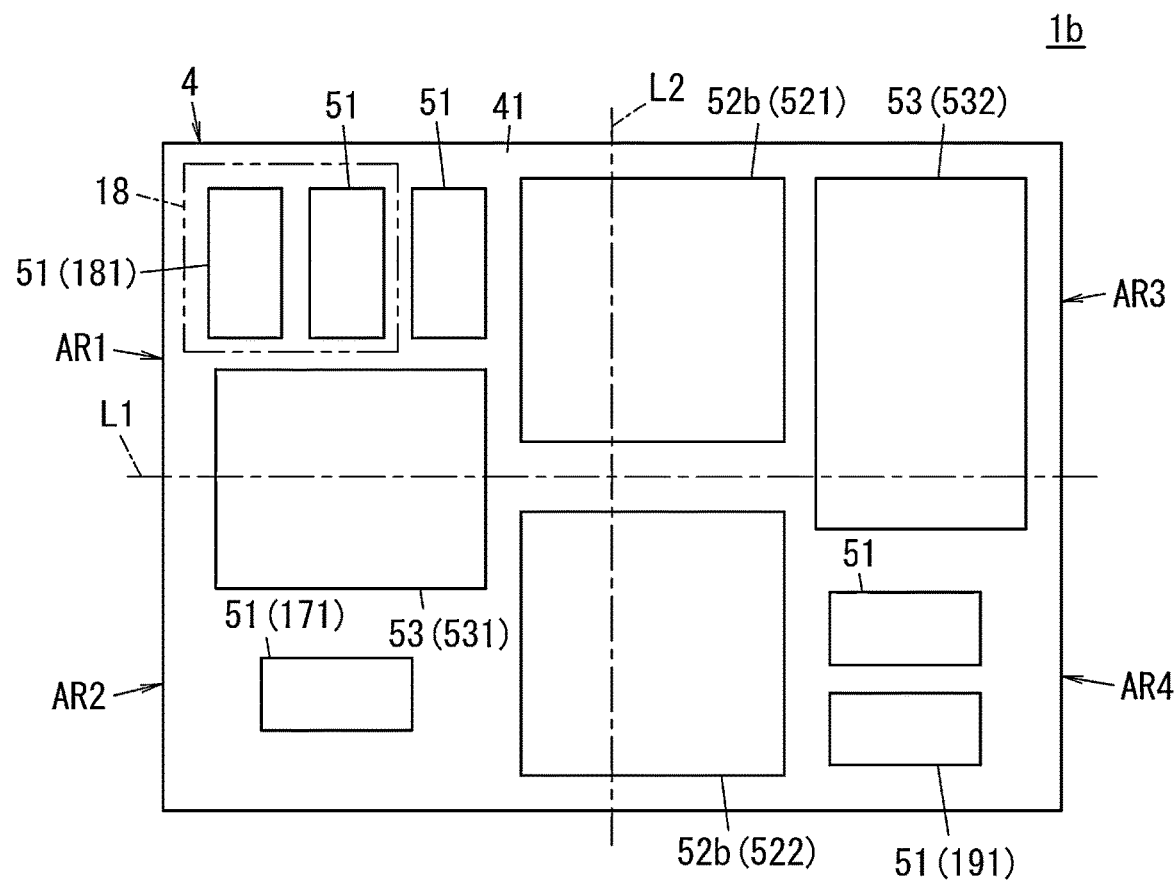
FIG. 11 is a plan view of a radio-frequency circuit according to a second modification of the second preferred embodiment of the present invention.

The radio-frequency circuit 1*b* according to the second modification differs from the radio-frequency circuit 1*a* according to the second preferred embodiment in that, as shown in FIG. 11, a plurality of (two in the illustrated example) electronic components 52*b* is provided instead of the second electronic component 52.

Each of the second electronic components 52*b* includes at least one acoustic wave filter. In the radio-frequency circuit 1*b* according to the second modification, a second electronic component 521 includes the first filter 121 (see FIG. 5) and the acoustic wave filter 122*b* of the second filter 122*a*. A second electronic component 522 includes the third filter 131 and the fourth filter 132. The details of each of the second electronic components 52*b* are similar to those of the second electronic component 52 according to the second preferred embodiment, so the description of the details is omitted.

In the radio-frequency circuit 1*b* according to the second modification as well, similar advantageous effects to those of the radio-frequency circuit 1*a* according to the second preferred embodiment are obtained.

Modifications

Hereinafter, modifications of the first and second preferred embodiments will be described.

Each of the first filter 121, the second filter 122, the acoustic wave filter 122*b* of the second filter 122*a*, the third filter 131, and the fourth filter 132 according to the first and second preferred embodiments is not limited to a surface acoustic wave filter and may be, for example, a bulk acoustic wave (BAW) filter. A resonator in the BAW filter is, for example, a film bulk acoustic resonator (FBAR) or a solidly mounted resonator (SMR). The BAW filter has a substrate. The substrate is, for example, a silicon substrate.

Each of the first filter 121, the second filter 122, the acoustic wave filter 122*b* of the second filter 122*a*, the third filter 131, and the fourth filter 132 according to the first and second preferred embodiments is not limited to a ladder filter and may be, for example, a longitudinally coupled resonator-type surface acoustic wave filter.

The above-described acoustic wave filter preferably is an acoustic wave filter that uses surface acoustic waves or bulk acoustic waves. However, the configuration is not limited thereto. The above-described acoustic wave filter may be, for example, an acoustic wave filter that uses boundary acoustic waves, plate waves, or the like.

The second major surface 42 of the mounting substrate 4 according to the second preferred embodiment may have a rectangular or substantially rectangular shape in plan view in the thickness direction of the mounting substrate 4, the imaginary straight line L1 is parallel or substantially parallel to the long sides of the rectangular shape, and the imaginary straight line L2 is parallel to the short sides of the rectangular shape. However, the configuration is not limited thereto. For example, the imaginary straight line L1 may be parallel or substantially parallel to a diagonal line of the rectangular or substantially rectangular shape, and the imaginary straight line L2 may be orthogonal to the imaginary straight line L1 at the center O1 of the second major surface 42. The imaginary straight line L1 does not need to be parallel to any of the short sides, the long sides, and the diagonal line of the rectangular or substantially rectangular shape as long as the imaginary straight line L1 passes through the center O1 of the second major surface 42. The shape of the second major surface 42 of the mounting substrate 4 in plan view in the thickness direction of the mounting substrate 4 is not limited to a rectangular or substantially rectangular shape and may be, for example, a selected shape, such as a circular or substantially circular shape and a hexagonal or substantially hexagonal shape. In this case, the imaginary straight line L1 and the imaginary straight line L2 are orthogonal to each other at the center O1 of the second major surface 42.

In the second preferred embodiment, the antenna terminal 161 is connected to the inductor 181 of the sixth filter 18, and the inductor 181 is disposed at a location that overlaps the region AR1 in plan view in the thickness direction of the mounting substrate 4. However, when further another electronic component is connected between the sixth filter 18 and the antenna terminal 161, the electronic component is disposed at a location that overlaps the region AR1 in plan view in the thickness direction of the mounting substrate 4. When the sixth filter 18 is not present, the electronic components including the first switch 11 are disposed at locations that overlap the region AR1 in plan view in the thickness direction of the mounting substrate 4. In other words, the electronic components connected to the antenna terminal 161 are disposed at locations that overlap the region AR1 in plan view in the thickness direction of the mounting substrate 4.

Similarly, further another electronic component may be present between the second switch 14 and the first input and output terminal 162, and the electronic component is disposed at a location that overlaps the region AR2 in plan view in the thickness direction of the mounting substrate 4. Similarly, further another electronic component may be present between the seventh filter 19 and the second input and output terminal 163, and the electronic component is disposed at a location that overlaps the region AR3 in plan view in the thickness direction of the mounting substrate 4. The seventh filter 19 does not need to be present. In this case, the electronic components including the third switch 15 are disposed at locations that overlap the region AR3 in plan view in the thickness direction of the mounting substrate 4.

In the second preferred embodiment, the second filter 122*a* is a hybrid filter. However, the configuration is not limited thereto. For example, any one or more of the first filter 121, the third filter 131, and the fourth filter 132 may be hybrid filters. In the first preferred embodiment, any one or more of the first filter 121, the second filter 122, the third filter 131, and the fourth filter 132 may be hybrid filters. In the second preferred embodiment, the radio-frequency circuit 1*a* may include the second filter 122 instead of the second filter 122*a*. In this case, the second electronic component 52 may include the first filter 121, the second filter 122, the third filter 131, and the fourth filter 132. In the second modification, the radio-frequency circuit 1*b* may include the second filter 122 instead of the second filter 122*a*. In this case, the second electronic component 521 includes the first filter 121 and the second filter 122.

In the second modification, the second electronic component 521 includes the first filter 121 and the acoustic wave filter 122b of the second filter 122a, and the second electronic component 522 includes the third filter 131 and the fourth filter 132. However, the configuration is not limited thereto. For example, a single electronic component may include the first filter 121 and the third filter 131, or four electronic components may respectively include filters different from one another.

In the first and second preferred embodiments, the first filter 121 and the third filter 131 are band pass filters, and the second filters 122, 122a and the fourth filter 132 are band elimination filters. However, the configuration is not limited thereto. At least one of the second filters 122, 122a and the fourth filter 132 may be a band pass filter or may be any one of a high-pass filter and a low-pass filter. For example, at least one of the first filter 121 and the third filter 131 may be any one of a band elimination filter, a high-pass filter, and a low-pass filter. For example, the second filter 122 or the second filter 122a may be any one of a band pass filter, a high-pass filter, and a low-pass filter.

A combination of communication bands in which the radio-frequency circuits 1, 1a, 1b perform simultaneous processing is not limited to the above-described combination. For example, a signal in a fourth communication band may be transmitted or received through the first input and output terminal 162 in the second mode. At this time, the fourth communication band preferably at least partially overlaps the first communication band.

In the specification, the state "an element is disposed on a first major surface of a substrate" includes not only a case where the element is directly mounted on the first major surface of the substrate but also a case where the element is disposed in, of a first major surface-side space and a second major surface-side space, separated by the substrate, the first major surface-side space. In other words, the state "an element is disposed on a first major surface of a substrate" includes a case where the element is mounted on the first major surface of the substrate with another circuit element, an electrode, or the like, interposed therebetween. The element is, for example, the first electronic component 51. However, the element is not limited to the first electronic component 51. The substrate is, for example, the mounting substrate 4. When the substrate is the mounting substrate 4, the first major surface is the first major surface 41, and the second major surface is the second major surface 42.

In the specification, the state "A and B are orthogonal to each other" includes not only a state where the angle between A and B is strictly 90 degrees but also a state where the angle between A and B falls within a range including an intersection at which advantageous effects are substantially obtained (for example, ±5 degrees). In the specification, the state "A and B are parallel to each other" includes not only a state where the angle between A and B is strictly zero degrees but also a state where the angle between A and B falls within a range including an intersection at which advantageous effects are substantially obtained (for example, about ±5 degrees).

Aspects

The following aspects are disclosed in the specification.

A radio-frequency circuit (1; 1a; 1b) according to a first aspect includes a first switch (11), a first filter (121), a second filter (122; 122a), a third filter (131), and a fourth filter (132). The first switch (11) has a first common terminal (110), a first selection terminal (111), and a second selection terminal (112). The first filter (121) is a band pass filter connected to the first selection terminal (111) of the first switch (11). The second filter (122; 122a) is a band elimination filter connected to the first selection terminal (111) of the first switch (11). The third filter (131) is a band pass filter connected to the second selection terminal (112) of the first switch (11). The fourth filter (132) is connected to the second selection terminal (112) of the first switch (11). The first switch (11) is capable of selectively connecting the first selection terminal (111) or the second selection terminal (112) to the first common terminal (110). A pass band (B1) of the first filter (121) and a rejection band (B2) of the second filter (122; 122a) overlap each other. The pass band (B1) of the first filter (121) and a pass band (B3) of the third filter (131) overlap each other.

With the radio-frequency circuit (1; 1a; 1b) according to the above aspect, a signal in a frequency band included in both the pass band (B1) of the first filter (121) and the rejection band (B2) of the second filter (122; 122a) is allowed to pass through the first filter (121) and rejected to pass through the second filter (122; 122a). A signal in a frequency band not included in the pass band (B1) of the first filter (121) or the rejection band (B2) of the second filter (122; 122a) is allowed to pass through the second filter (122; 122a) and rejected to pass through the first filter (121). Therefore, while the first common terminal (110) of the first switch (11) is connected to the first selection terminal (111), the radio-frequency circuit (1; 1a; 1b) is capable of performing simultaneous communication using two signals with different frequencies. In the radio-frequency circuit (1; 1a; 1b), the pass band (B1) of the first filter (121) and the pass band (B3) of the third filter (131) overlap each other. Therefore, when a frequency band included in both the pass band (B1) of the first filter (121) and the pass band (B3) of the third filter (131) but not included in the rejection band (B2) of the second filter (122; 122a), the frequency band can be processed through the third filter (131) by connecting the first common terminal (110) of the first switch (11) to the second selection terminal (112). In other words, in the radio-frequency circuit (1; 1a; 1b), a signal included in a frequency band included in both the pass band (B1) of the first filter (121) and the pass band (B3) of the third filter (131) can be used as one of two signals allowing for simultaneous communication. In addition, in the radio-frequency circuit (1; 1a; 1b), by switching the first switch (11), a combination of two signals allowing for simultaneous communication can be selected from between a combination allowing for simultaneous communication by using a combination of the first filter (121) and the second filter (122; 122a) and a combination allowing for simultaneous communication by using a combination of the third filter (131) and the fourth filter (132). Thus, a signal included in a frequency band included in both the pass band (B1) of the first filter (121) and the pass band (B3) of the third filter (131) is used as one of two signals allowing for simultaneous communication, and a combination of a signal not allowing for simultaneous communication by using a combination of the first filter (121) with the second filter (122; 122a) allows for simultaneous communication. Thus, with the radio-frequency circuit (1; 1a; 1b), the flexibility of combinations of two signals allowing for simultaneous communication improves.

A radio-frequency circuit (1; 1a; 1b) according to a second aspect, in the first aspect, further includes a second switch (14) and a third switch (15). The second switch (14) has a second common terminal (140), a third selection terminal (141), and a fourth selection terminal (142). The third switch (15) has a third common terminal (150), a fifth selection terminal (151), and a sixth selection terminal (152). The second switch (14) is capable of selectively connecting the third selection terminal (141) or the fourth selection terminal (142) to the second common terminal (140). The third switch (15) is capable of selectively connecting the fifth selection terminal (151) or the sixth selection terminal (152) to the third common terminal (150). The first filter (121) is connected between the first selection terminal (111) and the third selection terminal (141). The second filter (122; 122a) is connected between the first selection terminal (111) and the fifth selection terminal (151). The third filter (131) is connected between the second selection terminal (112) and the fourth selection terminal (142). The fourth filter (132) is connected between the second selection terminal (112) and the sixth selection terminal (152).

With the radio-frequency circuit (1; 1a; 1b) according to the above aspect, a signal path from the first filter (121) via the third selection terminal (141) to the second common terminal (140) and a signal path from the second filter (122; 122a) via the fifth selection terminal (151) to the third common terminal (150) are physically spaced apart from each other. Therefore, interference between a signal passing through the first filter (121) and a signal passing through the second filter (122; 122a) is reduced. With the radio-frequency circuit (1; 1a; 1b), a path between the first switch (11) and the second switch (14) can be selected from any one of a path passing through the first filter (121) and a path passing through the third filter (131). In addition, with the radio-frequency circuit (1; 1a; 1b), a path between the first switch (11) and the third switch (15) can be selected from any one of a path passing through the second filter (122; 122a) and a path passing through the fourth filter (132). Therefore, a combination between a frequency band caused to pass through a signal path from the first switch (11) to the second switch (14) and a frequency band caused to pass through a signal path from the first switch (11) to the third switch (15) can be switched by switching the first switch (11), the second switch (14), and the third switch (15).

In a radio-frequency circuit (1; 1a; 1b) according to a third aspect, in the first or second aspect, the pass band of the first filter (121) is a first frequency band (B1). The rejection band of the second filter (122; 122a) is a second frequency band (B2). The pass band of the third filter (131) is a third frequency band (B3). The fourth filter (132) is a band elimination filter that has a fourth frequency band (B4) as a rejection band. The first frequency band (B1) and the third frequency band (B3) overlap each other. The second frequency band (B2) and the fourth frequency band (B4) overlap each other.

With the radio-frequency circuit (1; 1a; 1b) according to the above aspect, when the first common terminal (110) of the first switch (11) is connected to the second selection terminal (112) as well, simultaneous communication using two signals with different frequencies is allowed with the third filter (131) and the fourth filter (132). Therefore, by switching the first switch (11), the second switch (14), and the third switch (15), simultaneous communication using two signals with different frequencies is allowed and a combination of the frequencies of two signals can be changed.

In a radio-frequency circuit (1; 1a; 1b) according to a fourth aspect, in the third aspect, there is a frequency included in only any one of the first frequency band (B1) and the third frequency band (B3). There is a frequency included in only any one of the second frequency band (B2) and the fourth frequency band (B4).

With the radio-frequency circuit (1; 1a; 1b) according to the above aspect, the pass band of a path from the first switch (11) to the second switch (14) is not completely the same between when the first common terminal (110) of the first switch (11) is connected to the first selection terminal (111) and when the first common terminal (110) of the first switch (11) is connected to the second selection terminal (112). Similarly, the pass band of a path from the first switch (11) to the third switch (15) is not completely the same between when the first common terminal (110) of the first switch (11) is connected to the first selection terminal (111) and when the first common terminal (110) of the first switch (11) is connected to the second selection terminal (112). Therefore, with the radio-frequency circuit (1; 1a; 1b), each of the pass band of the path from the first switch (11) to the second switch (14) and the pass band of the path from the first switch (11) to the third switch (15) can be changed with no overlap between the pass bands. In other words, with the radio-frequency circuit (1; 1a; 1b), simultaneous communication using two signals with different frequencies is allowed, and a combination of the frequencies of two signals can be changed.

In a radio-frequency circuit (1; 1a; 1b) according to a fifth aspect, in the first or second aspect, the pass band of the first filter (121) is a first frequency band (B1). The pass band of the third filter (131) is a third frequency band (B3). The fourth filter (132) is a band pass filter. The first frequency band (B1) and the third frequency band (B3) overlap each other. Part of the rejection band (B2) of the second filter (122; 122a) differs from a pass band (B5) of the fourth filter (132). The pass band (B3) of the third filter (131) and the pass band (B5) of the fourth filter (132) differ from each other.

With the radio-frequency circuit (1; 1a; 1b) according to the above aspect, as in the case of the radio-frequency circuit (1; 1a; 1b) according to the third aspect, when the first common terminal (110) of the first switch (11) is connected to the second selection terminal (112) as well, simultaneous communication using two signals with different frequencies is allowed with the third filter (131) and the fourth filter (132). Therefore, by switching the first switch (11), the second switch (14), and the third switch (15), the radio-frequency circuit (1; 1a; 1b) is capable of performing simultaneous communication using two signals with different frequencies by using any one of the path from the first switch (11) to the second switch (14) and the path from the first switch (11) to the third switch (15).

In a radio-frequency circuit (1a; 1b) according to a sixth aspect, in any one of the first to fifth aspects, at least one of the first filter (121), the second filter (122a), the third filter (131), and the fourth filter (132) is a hybrid filter. The hybrid filter (122a) includes an acoustic wave filter (122b) including one or more acoustic wave resonators (123), an inductor (122c), and a capacitor (122d).

With the radio-frequency circuit (1a; 1b) according to the above aspect, the pass band width of at least one of the first filter (121), the second filter (122a), the third filter (131), and the fourth filter (132) can be made wider than the pass band width of an acoustic wave filter. Therefore, the bandpass characteristics of each of the first filter (121), the second filter (122a), the third filter (131), and the fourth filter (132) are easily designed so as to be suitable for the operation of the radio-frequency circuit (1a; 1b) in the first mode and in the second mode.

In a radio-frequency circuit (1a; 1b) according to a seventh aspect, in the second aspect, the first switch (11) has a plurality of first switching circuits (311, 331). In the first switch (11), the first switching circuit (311, 331) is connected between the first common terminal (110) and the first selection terminal (111) and between the first common terminal (110) and the second selection terminal (112). Each of the second switch (14) and the third switch (15) has a plurality of second switching circuits (351, 371). In each of the second switch (14) and the third switch (15), the second switching circuit (351, 371) is connected between the second common terminal (140) and the third selection terminal (141), between the second common terminal (140) and the fourth selection terminal (142), between the third common terminal (150) and the fifth selection terminal (151), and between the third common terminal (150) and the sixth selection terminal (152). The number of switching elements (T31 to T34, T41 to T44) connected in series in the second switching circuit (351, 371) is less than the number of switching elements (T11 to T16, T21 to T26) connected in series in the first switching circuit (311, 331).

With the radio-frequency circuit (1a; 1b) according to the above aspect, the first switch (11) through which a larger electric power passes than the second switch (14) or the third switch (15) improves the withstand voltage characteristics of the first switching circuit (311, 331). On the other hand, the second switch (14) or the third switch (15) through which a smaller electric power passes than the first switch (11) decreases a loss in the second switching circuit (351, 371).

A radio-frequency circuit (1a; 1b) according to an eighth aspect, in the second aspect, further includes a mounting substrate (4), a fifth filter (17), a first external connection electrode (161), a second external connection electrode (162), a third external connection electrode (163), and a fourth external connection electrode (164). The mounting substrate (4) has a first major surface (41) and a second major surface (42) opposite to each other. The fifth filter (17) is connected to the first common terminal (110) of the first switch (11). The first switch (11), the second switch (14), the third switch (15), the first filter (121), the second filter (122a), the third filter (131), the fourth filter (132), and the fifth filter (17) are disposed on the first major surface (41) of the mounting substrate (4). The second major surface (42) has a first region (AR1), a second region (AR2), a third region (AR3), and a fourth region (AR4). The first region (AR1), the second region (AR2), the third region (AR3), and the fourth region (AR4) are partitioned by a first imaginary straight line (L1) and a second imaginary straight line (L2) in plan view in a thickness direction of the mounting substrate (4). The first imaginary straight line (L1) passes through a center (O1) of the second major surface (42). The second imaginary straight line (L2) passes through the center (O1) of the second major surface (42) and is orthogonal to the first imaginary straight line (L1). The first external connection electrode (161) is disposed in the first region (AR1) and is connected to the first common terminal (110) of the first switch (11). The second external connection electrode (162) is disposed in the second region (AR2) and is connected to the second common terminal (140) of the second switch (14). The third external connection electrode (163) is disposed in the third region (AR3) and is connected to the third common terminal (150) of the third switch (15). The fourth external connection electrode (164) is disposed in the fourth region (AR4) and is connected to the fifth filter (17).

With the radio-frequency circuit (1a; 1b) according to the above aspect, the first external connection electrode (161), the second external connection electrode (162), the third external connection electrode (163), and the fourth external connection electrode (164) are disposed so as to be spaced apart from one another. Therefore, isolation among a signal that passes through the second external connection electrode (162), a signal that passes through the third external connection electrode (163), and a signal that passes through the fourth external connection electrode (164) is improved.

In a radio-frequency circuit (1a; 1b) according to a ninth aspect, in the eighth aspect, in plan view in a thickness of the mounting substrate (4), the first switch (11) overlaps the first region (AR1). In plan view in the thickness of the mounting substrate (4), the second switch (14) overlaps the second region (AR2). In plan view in the thickness of the mounting substrate (4), the third switch (15) overlaps the third region (AR3). In plan view in the thickness of the mounting substrate (4), the fifth filter (17) overlaps the fourth region (AR4).

With the radio-frequency circuit (1a; 1b) according to the above aspect, a wire length between an electronic component disposed on the first major surface 41 of the mounting substrate 4 and each of the first external connection electrode (161), the second external connection electrode (162), the third external connection electrode (163), and the fourth external connection electrode (164) is reduced. Distances between wires respectively connected to the first external connection electrode (161), the second external connection electrode (162), the third external connection electrode (163), and the fourth external connection electrode (164) are increased. Therefore, a transmission loss of each of a signal that passes through the second external connection electrode (162), a signal that passes through the third external connection electrode (163), and a signal that passes through the fourth external connection electrode (164) is reduced, and mutual isolation is improved.

In a radio-frequency circuit (1; 1b) according to a tenth aspect, in the eighth or ninth aspect, the first filter (121) and the second filter (122) are provided in a first electronic component (521) that is a single electronic component. The third filter (131) and the fourth filter (132) are provided in a second electronic component (522) that is a single electronic component.

With the radio-frequency circuit (1; 1b) according to the above aspect, the size of the radio-frequency circuit (1b) is reduced by integrating two filters through which two signals used for simultaneous communication respectively pass as a single electronic component.

In a radio-frequency circuit (1; 1a) according to an eleventh aspect, in the eighth or ninth aspect, the first filter (121), the second filter (122), the third filter (131), and the fourth filter (132) are provided in a single electronic component (52).

With the radio-frequency circuit (1; 1a) according to the above aspect, the size of the radio-frequency circuit (1a) is reduced by integrating the first filter (121) to the fourth filter (132) as a single electronic component (52).

A communication device (10) according to a twelfth aspect includes the radio-frequency circuit (1; 1a; 1b) according to any one of the first to eleventh aspects, and a signal processing circuit (2).

With the communication device (10) according to the above aspect, a signal in a frequency band included in both the pass band (B1) of the first filter (121) and the rejection band (B2) of the second filter (122; 122a) is allowed to pass through the first filter (121) and rejected to pass through the second filter (122; 122a). A signal in a frequency band not included in the pass band (B1) of the first filter (121) or the rejection band (B2) of the second filter (122; 122a) is allowed to pass through the second filter (122) and rejected to pass through the first filter (121). Therefore, while the first common terminal (110) of the first switch (11) is connected to the first selection terminal (111), the radio-frequency circuit (1; 1a; 1b) is capable of performing simultaneous communication using two signals with different frequencies. In the radio-frequency circuit (1; 1a; 1b), there is a frequency band included in both the pass band (B1) of the first filter (121) and the pass band (B3) of the third filter (131). Therefore, when a frequency band included in both the pass band (B1) of the first filter (121) and the pass band (B3) of the third filter (131) but not included in the rejection band (B2) of the second filter (122; 122a), the frequency band can be processed through the third filter (131) by connecting the first common terminal (110) of the first switch (11) to the second selection terminal (112). Therefore, with the communication device (10), the flexibility of combinations of two signals allowing for simultaneous communication improves.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency circuit comprising:
    a first switch including a first common terminal, a first selection terminal, and a second selection terminal;
    a first filter that is a band pass filter and that is connected to the first selection terminal of the first switch;
    a second filter that is a band elimination filter and that is connected to the first selection terminal of the first switch;
    a third filter that is a band pass filter and that is connected to the second selection terminal of the first switch;
    a fourth filter connected to the second selection terminal of the first switch;
    a second switch including a second common terminal, a third selection terminal, and a fourth selection terminal; and
    a third switch including a third common terminal, a fifth selection terminal, and a sixth selection terminal; wherein
    the first switch is capable of selectively connecting the first selection terminal or the second selection terminal to the first common terminal;
    a pass band of the first filter and a rejection band of the second filter overlap each other;
    the pass band of the first filter and a pass band of the third filter overlap each other;
    the second switch is capable of selectively connecting the third selection terminal or the fourth selection terminal to the second common terminal;
    the third switch is capable of selectively connecting the fifth selection terminal or the sixth selection terminal to the third common terminal;
    the first filter is connected between the first selection terminal and the third selection terminal;
    the second filter is connected between the first selection terminal and the fifth selection terminal;
    the third filter is connected between the second selection terminal and the fourth selection terminal; and
    the fourth filter is connected between the second selection terminal and the sixth selection terminal.

2. The radio-frequency circuit according to claim 1, wherein
    at least one of the first filter, the second filter, the third filter, and the fourth filter is a hybrid filter; and
    the hybrid filter includes:
        an acoustic wave filter including one or more acoustic wave resonators; and
        an inductor and a capacitor.

3. The radio-frequency circuit according to claim 1, wherein
    the first switch includes a plurality of first switching circuits;
    the first switching circuit is connected between the first common terminal and the first selection terminal and between the first common terminal and the second selection terminal;
    each of the second switch and the third switch includes a plurality of second switching circuits;
    the second switching circuit is connected between the second common terminal and the third selection terminal, between the second common terminal and the fourth selection terminal, between the third common terminal and the fifth selection terminal, and between the third common terminal and the sixth selection terminal; and
    a number of switches connected in series in the second switching circuit is less than a number of switches connected in series in the first switching circuit.

4. The radio-frequency circuit according to claim 1, further comprising:
    a mounting substrate including a first major surface and a second major surface opposite to each other;
    a fifth filter connected to the first common terminal of the first switch; and
    a first external connection electrode, a second external connection electrode, a third external connection electrode, and a fourth external connection electrode; wherein
    the first switch, the second switch, the third switch, the first filter, the second filter, the third filter, the fourth filter, and the fifth filter are located on the first major surface of the mounting substrate;
    the second major surface includes a first region, a second region, a third region, and a fourth region;
    the first region, the second region, the third region, and the fourth region are partitioned by a first imaginary straight line passing through a center of the second major surface and a second imaginary straight line orthogonal to the first imaginary straight line passing through the center of the second major surface in plan view in a thickness direction of the mounting substrate;
    the first external connection electrode is in the first region and connected to the first common terminal of the first switch;
    the second external connection electrode is in the second region and connected to the second common terminal of the second switch;
    the third external connection electrode is in the third region and connected to the third common terminal of the third switch; and
    the fourth external connection electrode is in the fourth region and connected to the fifth filter.

5. The radio-frequency circuit according to claim 4, wherein in plan view in the thickness direction of the mounting substrate:
    the first switch overlaps the first region;
    the second switch overlaps the second region;
    the third switch overlaps the third region; and
    the fifth filter overlaps the fourth region.

6. The radio-frequency circuit according to claim 4, wherein
the first filter and the second filter are provided in a first electronic component that is a single electronic component; and
the third filter and the fourth filter are provided in a second electronic component that is a single electronic component.

7. The radio-frequency circuit according to claim 4, wherein the first filter, the second filter, the third filter, and the fourth filter are provided in a single electronic component.

8. A communication device comprising:
the radio-frequency circuit according to claim 1; and
a signal processing circuit connected to the radio-frequency circuit.

9. The communication device according to claim 8, wherein
the pass band of the first filter is a first frequency band;
the rejection band of the second filter is a second frequency band;
the pass band of the third filter is a third frequency band;
the fourth filter is a band elimination filter that has a fourth frequency band as a rejection band;
the first frequency band and the third frequency band overlap each other; and
the second frequency band and the fourth frequency band overlap each other.

10. The communication device according to claim 9, wherein
there is a frequency included in only one of the first frequency band and the third frequency band; and
there is a frequency included in only one of the second frequency band and the fourth frequency band.

11. The communication device according to claim 8, wherein
the pass band of the first filter is a first frequency band;
the pass band of the third filter is a third frequency band;
the fourth filter is a band pass filter;
the first frequency band and the third frequency band overlap each other;
a portion of the rejection band of the second filter differs from a pass band of the fourth filter; and
the pass band of the third filter and the pass band of the fourth filter differ from each other.

12. The communication device according to claim 8, wherein
at least one of the first filter, the second filter, the third filter, and the fourth filter is a hybrid filter; and
the hybrid filter includes:
an acoustic wave filter including one or more acoustic wave resonators; and
an inductor and a capacitor.

13. The communication device according to claim 8, wherein the first switch includes a plurality of first switching circuits; the first switching circuit is connected between the first common terminal and the first selection terminal and between the first common terminal and the second selection terminal; each of the second switch and the third switch includes a plurality of second switching circuits; the second switching circuit is connected between the second common terminal and the third selection terminal, between the second common terminal and the fourth selection terminal, between the third common terminal and the fifth selection terminal, and between the third common terminal and the sixth selection terminal; and a number of switches connected in series in the second switching circuit is less than a number of switches connected in series in the first switching circuit.

14. The communication device according to claim 8, further comprising:
a mounting substrate including a first major surface and a second major surface opposite to each other;
a fifth filter connected to the first common terminal of the first switch; and
a first external connection electrode, a second external connection electrode, a third external connection electrode, and a fourth external connection electrode; wherein
the first switch, the second switch, the third switch, the first filter, the second filter, the third filter, the fourth filter, and the fifth filter are located on the first major surface of the mounting substrate;
the second major surface includes a first region, a second region, a third region, and a fourth region;
the first region, the second region, the third region, and the fourth region are partitioned by a first imaginary straight line passing through a center of the second major surface and a second imaginary straight line orthogonal to the first imaginary straight line passing through the center of the second major surface in plan view in a thickness direction of the mounting substrate;
the first external connection electrode is in the first region and connected to the first common terminal of the first switch;
the second external connection electrode is in the second region and connected to the second common terminal of the second switch;
the third external connection electrode is in the third region and connected to the third common terminal of the third switch; and
the fourth external connection electrode is in the fourth region and connected to the fifth filter.

15. The communication device according to claim 14, wherein in plan view in the thickness direction of the mounting substrate:
the first switch overlaps the first region;
the second switch overlaps the second region;
the third switch overlaps the third region; and
the fifth filter overlaps the fourth region.

16. A radio-frequency circuit comprising:
a first switch including a first common terminal, a first selection terminal, and a second selection terminal;
a first filter that is a band pass filter and that is connected to the first selection terminal of the first switch;
a second filter that is a band elimination filter and that is connected to the first selection terminal of the first switch;
a third filter that is a band pass filter and that is connected to the second selection terminal of the first switch; and
a fourth filter connected to the second selection terminal of the first switch; wherein
the first switch is capable of selectively connecting the first selection terminal or the second selection terminal to the first common terminal;
a pass band of the first filter and a rejection band of the second filter overlap each other;
the pass band of the first filter and a pass band of the third filter overlap each other;
the pass band of the first filter is a first frequency band;
the rejection band of the second filter is a second frequency band;

the pass band of the third filter is a third frequency band;
the fourth filter is a band elimination filter that has a fourth frequency band as a rejection band;
the first frequency band and the third frequency band overlap each other; and
the second frequency band and the fourth frequency band overlap each other.

17. The radio-frequency circuit according to claim 16, wherein
there is a frequency included in only one of the first frequency band and the third frequency band; and
there is a frequency included in only one of the second frequency band and the fourth frequency band.

18. A radio-frequency circuit comprising:
a first switch including a first common terminal, a first selection terminal, and a second selection terminal;
a first filter that is a band pass filter and that is connected to the first selection terminal of the first switch;
a second filter that is a band elimination filter and that is connected to the first selection terminal of the first switch;
a third filter that is a band pass filter and that is connected to the second selection terminal of the first switch; and
a fourth filter connected to the second selection terminal of the first switch; wherein
the first switch is capable of selectively connecting the first selection terminal or the second selection terminal to the first common terminal;
a pass band of the first filter and a rejection band of the second filter overlap each other;
the pass band of the first filter and a pass band of the third filter overlap each other;
the pass band of the first filter is a first frequency band;
the pass band of the third filter is a third frequency band;
the fourth filter is a band pass filter;
the first frequency band and the third frequency band overlap each other;
a portion of the rejection band of the second filter differs from a pass band of the fourth filter; and
the pass band of the third filter and the pass band of the fourth filter differ from each other.

* * * * *